United States Patent
Kato et al.

(10) Patent No.: US 11,683,601 B2
(45) Date of Patent: Jun. 20, 2023

(54) IMAGING DEVICE AND ELECTRONIC APPARATUS

(71) Applicant: SONY CORPORATION, Tokyo (JP)

(72) Inventors: Nanako Kato, Kanagawa (JP); Toshifumi Wakano, Kanagawa (JP); Yusuke Otake, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/933,379

(22) Filed: Jul. 20, 2020

(65) Prior Publication Data
US 2020/0366856 A1 Nov. 19, 2020

Related U.S. Application Data

(63) Continuation of application No. 16/122,753, filed on Sep. 5, 2018, now Pat. No. 11,044,428, which is a (Continued)

(30) Foreign Application Priority Data

Feb. 28, 2014 (JP) .................................. 2014-038584

(51) Int. Cl.
*H04N 5/357* (2011.01)
*H04N 5/374* (2011.01)
(Continued)

(52) U.S. Cl.
CPC ....... *H04N 25/60* (2023.01); *H01L 27/14603* (2013.01); *H01L 27/14609* (2013.01); (Continued)

(58) Field of Classification Search
CPC .. H04N 5/357; H04N 5/37457; H04N 5/3745; H04N 5/378; H01L 27/14603; H01L 27/14609; H01L 27/14641
See application file for complete search history.

(56) References Cited

U.S. PATENT DOCUMENTS 6,657,665 B1 * 12/2003 Guidash ............ H01L 27/14603
348/E3.018
10,075,659 B2  9/2018 Kato et al.
(Continued)

FOREIGN PATENT DOCUMENTS

CN  1953193 A   4/2007
CN  101290943 A  10/2008
(Continued)

OTHER PUBLICATIONS

Non-Final Office Action for U.S. Appl. No. 16/122,753 dated Jul. 23, 2020.
(Continued)

*Primary Examiner* — Abdelaaziz Tissire
(74) *Attorney, Agent, or Firm* — Chip Law Group

(57) ABSTRACT

Imaging devices and electronic apparatuses with one or more shared pixel structures are provided. The shared pixel structure includes a plurality of photoelectric conversion devices or photodiodes. Each photodiode in the shared pixel structure is located within a rectangular area. The shared pixel structure also includes a plurality of shared transistors. The shared transistors in the shared pixel structure are located adjacent the photoelectric conversion devices of the shared pixel structure. The rectangular area can have two short sides and two long sides, with the shared transistors located along one of the long sides. In addition, a length of one or more of the transistors can be extended in a direction parallel to the long side of the rectangular area.

11 Claims, 13 Drawing Sheets

Related U.S. Application Data continuation of application No. 15/119,499, filed as application No. PCT/JP2015/000821 on Feb. 20, 2015, now Pat. No. 10,075,659.

(51) Int. Cl.
| | | |
|---|---|---|
| H01L 27/146 | (2006.01) | |
| H04N 5/378 | (2011.01) | |
| H04N 25/60 | (2023.01) | |
| H04N 25/77 | (2023.01) | |
| H04N 25/778 | (2023.01) | |
| H04N 25/75 | (2023.01) | |

(52) U.S. Cl.
CPC ....... *H01L 27/14641* (2013.01); *H04N 25/77* (2023.01); *H04N 25/778* (2023.01); *H04N 25/75* (2023.01)

(56) References Cited

U.S. PATENT DOCUMENTS

| | | | | |
|---|---|---|---|---|
| 2005/0128327 | A1* | 6/2005 | Bencuya | H01L 27/14603 348/308 |
| 2006/0146158 | A1* | 7/2006 | Toros | H01L 27/14643 348/308 |
| 2007/0069248 | A1* | 3/2007 | Ohta | H01L 27/14636 257/292 |
| 2007/0091190 | A1* | 4/2007 | Iwabuchi | H01L 27/14609 348/294 |
| 2007/0131992 | A1* | 6/2007 | Dosluoglu | H01L 27/14641 257/292 |
| 2008/0303930 | A1* | 12/2008 | Kuroda | H04N 5/365 348/308 |
| 2009/0053848 | A1* | 2/2009 | Fan | H01L 27/14689 438/59 |
| 2009/0090845 | A1* | 4/2009 | Yin | H04N 5/37457 438/73 |
| 2009/0140304 | A1* | 6/2009 | Kudoh | H01L 27/14643 257/292 |
| 2009/0219422 | A1* | 9/2009 | Takeuchi | H04N 5/37457 348/300 |
| 2009/0237543 | A1 | 9/2009 | Hatano et al. | |
| 2009/0303365 | A1* | 12/2009 | Watanabe | H01L 27/14641 348/302 |
| 2010/0045833 | A1 | 2/2010 | Iwabuchi et al. | |
| 2010/0045834 | A1 | 2/2010 | Iwabuchi et al. | |
| 2010/0177226 | A1* | 7/2010 | Itonaga | H04N 5/378 348/300 |
| 2010/0230583 | A1* | 9/2010 | Nakata | H01L 27/14605 250/227.2 |
| 2010/0245648 | A1* | 9/2010 | Tayanaka | H01L 31/0232 348/308 |
| 2011/0073923 | A1* | 3/2011 | Tatani | H01L 27/1463 257/291 |
| 2011/0080509 | A1 | 4/2011 | Katsuno et al. | |
| 2011/0127408 | A1* | 6/2011 | Yanagita | H01L 27/14603 250/208.1 |
| 2011/0128400 | A1 | 6/2011 | Wakano et al. | |
| 2011/0181747 | A1* | 7/2011 | Kido | H01L 27/14614 348/222.1 |
| 2013/0049082 | A1* | 2/2013 | Kato | H01L 27/14641 257/292 |
| 2013/0146748 | A1* | 6/2013 | Ishiwata | H01L 27/14641 250/208.1 |
| 2014/0204255 | A1 | 7/2014 | Kido et al. | |
| 2014/0211053 | A1 | 7/2014 | Kido et al. | |
| 2015/0029375 | A1* | 1/2015 | Sugawa | H04N 5/3745 348/308 |
| 2015/0123172 | A1* | 5/2015 | Chen | H01L 27/14645 257/230 |
| 2015/0319392 | A1 | 11/2015 | Kido et al. | |
| 2016/0112664 | A1 | 4/2016 | Kido et al. | |
| 2016/0372504 | A1 | 12/2016 | Kato et al. | |
| 2017/0013211 | A1 | 1/2017 | Kato et al. | |
| 2017/0085822 | A1 | 3/2017 | Kido et al. | |
| 2017/0110503 | A1 | 4/2017 | Kato et al. | |
| 2018/0146153 | A1 | 5/2018 | Kido et al. | |
| 2018/0190709 | A1 | 7/2018 | Lee et al. | |
| 2018/0191980 | A1* | 7/2018 | Yun | H01L 27/14641 |
| 2019/0115379 | A1 | 4/2019 | Kato et al. | |
| 2020/0230583 | A1 | 7/2020 | Nakata | |

FOREIGN PATENT DOCUMENTS

| | | | | |
|---|---|---|---|---|
| CN | 102034835 A | 4/2011 | | |
| CN | 102157536 A | 8/2011 | | |
| CN | 102956660 A | 3/2013 | | |
| CN | 104795416 A | 7/2015 | | |
| CN | 104795417 A | 7/2015 | | |
| CN | 104851898 A | 8/2015 | | |
| CN | 107040735 A | 8/2017 | | |
| CN | 107370970 A | 11/2017 | | |
| EP | 2563011 A2 * | 2/2013 | ....... | H01L 27/14603 |
| EP | 2563011 A2 | 2/2013 | | |
| JP | 2007-095917 A | 4/2007 | | |
| JP | 2007-115994 A | 5/2007 | | |
| JP | 2008-270299 A | 11/2008 | | |
| JP | 2011-071347 A | 4/2011 | | |
| JP | 2011-155596 A | 8/2011 | | |
| JP | 4752447 B2 | 8/2011 | | |
| JP | 2013-062789 A | 4/2013 | | |
| JP | 2013-120813 A | 6/2013 | | |
| JP | 5537172 B2 | 7/2014 | | |
| JP | 6003291 B2 | 10/2016 | | |
| KR | 10-2007-0043656 A | 4/2007 | | |
| KR | 10-2010-0109400 A | 10/2010 | | |
| KR | 10-2011-0033780 A | 3/2011 | | |
| KR | 10-2011-0088396 A | 8/2011 | | |
| KR | 10-2013-0021330 A | 3/2013 | | |
| KR | 10-2016-0100895 A | 8/2016 | | |
| KR | 10-2017-0104130 A | 9/2017 | | |
| TW | 200917473 A | 4/2009 | | |
| TW | I317553 B | 11/2009 | | |
| TW | 201310630 A | 3/2013 | | |
| TW | 201620127 A | 6/2016 | | |
| WO | 2009/029379 A1 | 3/2009 | | |

OTHER PUBLICATIONS

Office Action for JP Patent Application No. 2017-091696, dated Dec. 5, 2017, 07 pages of Office Action and 05 pages of English Translation.

Office Action for EP Patent Application No. 15711310.1, dated Feb. 14, 2018, 04 pages.

Office Action for JP Patent Application No. 2014-038584, dated Feb. 7, 2017, 05 pages.

Office Action for JP Patent Application No. 2014-038584, dated Jul. 24, 2017, 08 pages of Office Action and 07 pages of English Translation.

Office Action for JP Patent Application No. 2014-038584, dated Nov. 17, 2016, 17 pages.

Office Action for CN Patent Application No. 201580009596.4, dated Oct. 29, 2018, 05 pages of Office Action and 09 pages of English Translation.

Extended European Search Report of EP Application No. 19154945. 0, dated Jun. 28, 2019, 05 pages.

Office Action for JP Patent Application No. 2017-091696, dated Jul. 4, 2019, 16 pages of Office Action and 09 pages of English Translation.

International Search Report and Written Opinion of PCT Application No. PCT/JP2015/000821, dated Jun. 1, 2015, 07 pages of ISRWO.

International Preliminary Report on Patentability of PCT Application No. PCT/JP2015/000821, dated Sep. 15, 2016, 06 pages of IPRP.

Non-Final Office Action for U.S. Appl. No. 15/119,499, dated May 3, 2017, 20 pages.

(56) References Cited

OTHER PUBLICATIONS

Final Office Action for U.S. Appl. No. 15/119,499, dated Dec. 12, 2017, 16 pages.
Notice of Allowance for U.S. Appl. No. 15/119,499, dated May 18, 2018, 09 pages.
Notice of Allowance for U.S. Appl. No. 15/119,499, dated Jun. 20, 2018, 02 pages.
Non-Final Office Action for U.S. Appl. No. 16/122,753, dated Nov. 16, 2018, 21 pages.
Non-Final Office Action for U.S. Appl. No. 16/122,753, dated Oct. 18, 2019, 22 pages.
Non-Final Office Action for U.S. Appl. No. 16/122,753, dated Jul. 23, 2020, 17 pages.
Final Office Action for U.S. Appl. No. 16/122,753, dated Jun. 20, 2019, 27 pages.
Final Office Action for U.S. Appl. No. 16/122,753, dated Mar. 24, 2020, 23 pages.
Office Action for JP Patent Application No. 2017-091696, dated May 8, 2018, 09 pages of Office Action and 05 pages of English Translation.
Advsiory Office Action for U.S. Appl. No. 16/122,753, dated Jun. 4, 2020, 04 pages.
Notice of Allowance for U.S. Appl. No. 16/122,753 dated Feb. 23, 2021.
Office Action for KR Patent Application No. 10-2016-7022090, dated Jul. 1, 2021, 04 pages of English Translation and 05 pages of Office Action.
Office Action for KR Patent Application No. 10-2016-7022090, dated Jan. 12, 2022, 02 pages of English Translation and 02 pages of Office Action.
Office Action for CN Patent Application No. 202010118252.X, dated Mar. 8, 2023, 07 pages of English Translation and 06 pages of Office Action.

* cited by examiner

IMAGING DEVICE AND ELECTRONIC APPARATUS

CROSS REFERENCE TO RELATED APPLICATIONS

The present application is a continuation application of U.S. patent application Ser. No. 16/122,753, filed Sep. 5, 2018 which is a continuation application of U.S. patent application Ser. No. 15/119,499, filed Aug. 17, 2016, now U.S. Pat. No. 10,075,659, which is a U.S. National Phase of International Patent Application No. PCT/JP2015/000821 filed on Feb. 20, 2015, which claims the benefit of Japanese Priority Patent Application JP 2014-038584 filed on Feb. 28, 2014, the entire content of which is incorporated herein by reference.

TECHNICAL FIELD

The present disclosure relates to an imaging device and an electronic apparatus, particularly the solid-state imaging device and the electronic apparatus in which random noise can be improved.

BACKGROUND ART

In a backside illumination type CMOS image sensor disclosed in Patent Literature 1, which adopts a pixel sharing layout as a countermeasure against PRNU (photo response non uniformity: sensitivity un uniformity), pixel transistors (hereinafter, referred to as pixel Tr.) are divided into two groups, and Trs. are symmetrically arranged.

This technology is directed to equalize an amount of reflection or absorption of incident light from the back surface side by polysilicon of the transistors (Trs.) between the two groups by symmetrically arranging an amplification Tr. (hereinafter referred to as AMP), a selection Tr. (hereinafter referred to as SEL), and a reset Tr. (hereinafter referred to as RST) with respect to a photodiode (hereinafter referred to as PD).

CITATION LIST

Patent Literature

[PTL 1]
JP 2013-62789A

SUMMARY

Technical Problem

However, according to the technology disclosed in Patent Literature 1, an L-length of each of the transistors cannot be elongated because the pixel Trs. are divided into the two groups. As a result, RN (random noise) problems may be increased.

More specifically, in the case where the AMP and SEL are arranged in a first group (group 1) and two Trs. are arranged in a second group (group 2), the required number of source-drain is three in the group 1 and three in the group 2, that is, in total six. At this point, there is a limit in elongating the L-length of the Tr. because of limitation in a lithography line width, limitation in processing the polysilicon and a contact hole, securing isolation breakdown voltage, and so on. Particularly, in the case of miniaturization, the influence from such a state is quite serious, and RN margin may deteriorate due to the short L-length of the AMP.

The present disclosure is achieved in consideration of the above-described situation, and random noise margin can be improved by the present disclosure.

Solution to Problem

A solid-state imaging device according to an embodiment of the present technology includes: a photoelectric conversion element group including a sharing unit shaped in a rectangle; and a pixel transistor group arranged as one group in long side direction of the photoelectric conversion element group, wherein respective pixel transistors of the pixel transistor group are arranged so as to be substantially symmetric with respect to the photoelectric conversion element group.

A dummy transistor is included in the pixel transistor group.

The pixel transistor group is arranged at a position shifted from the rectangular shaped sharing unit of the photoelectric conversion element group.

An L-length of an amplification transistor included in the pixel transistor group is longer than L-lengths of other transistors included in the pixel transistor group.

The L-length of the amplification transistor included in the pixel transistor group is 0.6 to 1.4 times of a pitch of the photoelectric conversion element group.

An L-length of a selection transistor included in the pixel transistor group is longer than L-lengths of other transistors included in the pixel transistor group.

A well contact is further provided between the photoelectric conversion element group and another photoelectric conversion element group positioned next to the photoelectric conversion element group.

A well contact is further provided between the pixel transistor group and another pixel transistor group positioned next to the pixel transistor group.

The solid-state imaging device is a backside illumination type.

An electronic apparatus according to an embodiment of the present disclosure includes:
a solid-state imaging device including a photoelectric conversion element group having a sharing unit shaped in a rectangle, and a pixel transistor group arranged as one group in a direction of a long side of the photoelectric conversion element group, wherein respective pixel transistors of the pixel transistor group are arranged so as to be substantially symmetric with respect to the photoelectric conversion element group;
a signal processing circuit configured to process an output signal output from the solid-state imaging device; and
an optical system configured to irradiate the solid-state imaging device with incident light.

A dummy transistor is included in the pixel transistor group.

The pixel transistor group is arranged at a position shifted from the rectangular shaped sharing unit of the photoelectric conversion element group.

An L-length of an amplification transistor included in the pixel transistor group is longer than L-lengths of other transistors included in the pixel transistor group.

The L-length of the amplification transistor included in the pixel transistor group is 0.6 to 1.4 times of a pitch of the photoelectric conversion element group.

A well contact is further provided between the photoelectric conversion element group and another photoelectric conversion element group positioned next to the photoelectric conversion element group.

A well contact is further provided between the pixel transistor group and another pixel transistor group positioned next to the pixel transistor group.

The solid-state imaging device is a backside illumination type.

According to an embodiment of the present technology, a photoelectric conversion element group includes a sharing unit shaped in a rectangle, and a pixel transistor group is arranged, as a group, in a direction of a long side of the photoelectric conversion element group. Further, respective pixel transistors of the pixel transistor group are arranged so as to be substantially symmetric with respect to the photoelectric conversion element group.

Advantageous Effects of Invention

According to an embodiment of the present technology, polysilicon forming the transistors can be arranged substantially symmetrically with respect to the photodiodes. Further, according to an embodiment of the present technology, random noise can be decreased.

Note that the effects recited in the present invention are mere examples, and the effects of the present technology are not limited to the effects recited in the present specification and may include additional effects.

DETAILED DESCRIPTION

In the following, embodiments to implement the present disclosure (hereinafter referred to as embodiments) will be described. Note that a description will be provided in the following order.

0. Example of Schematic Configuration of Solid-state Imaging Device
1. First Embodiment (example of 4-Tr. type, 8-pixel sharing)
2. Second Embodiment (example of 4-Tr. type, 2-pixel sharing)
3. Third embodiment (example of 4-Tr. type, 16-pixel sharing)
4. Fourth Embodiment (example of 3-Tr. type, 8-pixel sharing)
5. Fifth Embodiment (example of an electronic apparatus)
0. Example of Schematic Configuration of Solid-state Imaging Device Example of Schematic Configuration of Solid-State Imaging Device FIG. 1 is a diagram illustrating an example of a schematic configuration of a CMOS (Complementary Metal Oxide Semiconductor) solid-state imaging device applied to respective embodiments of the present technology.

Figure 1:
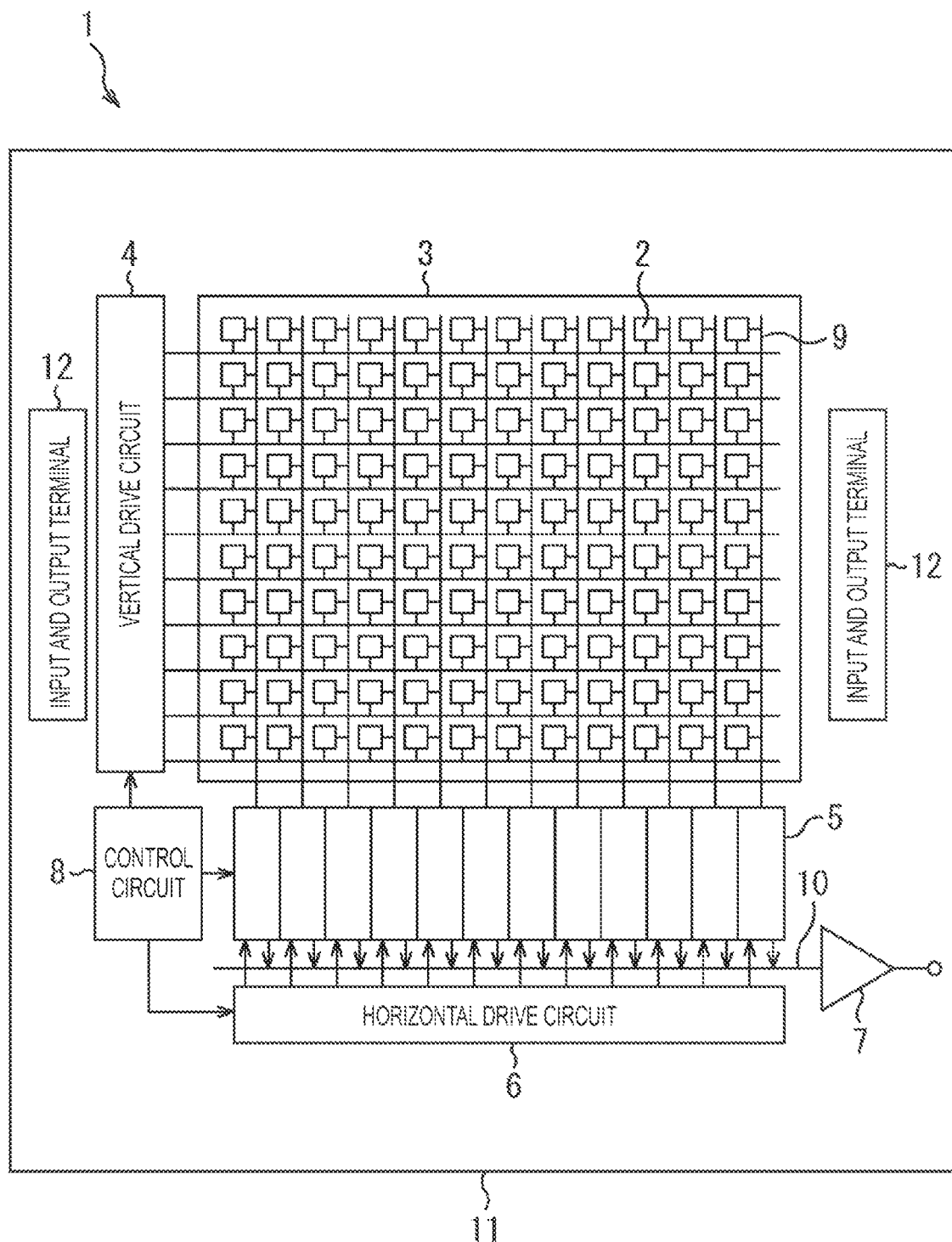
FIG. 1 is a block diagram illustrating an example schematic configuration of a solid-state imaging device to which the present technology is applied.

As illustrated in FIG. 1, a solid-state imaging device (device chip) 1 includes a pixel area (so-called imaging area) 3 and a peripheral circuit. In the pixel area 3, pixels 2 including a plurality of photoelectric conversion elements are regularly and two-dimensionally arrayed on a semiconductor substrate 11 (e.g., silicon substrate).

The pixel 2 includes a photoelectric conversion element (e.g., photodiode) and a plurality of pixel transistors (so-called MOS transistors). The plurality of pixel transistors may include three transistors such as a transfer transistor, a reset transistor, and an amplification transistor, and also may include four transistors by further adding a selection transistor. An equivalent circuit of each pixel 2 (unit pixel) is same as those generally applied, and therefore a description therefor will be omitted here.

Also, the pixel 2 may have a structure of pixel sharing. The structure of pixel sharing includes a plurality of photodiodes, a plurality of transfer transistors, one floating diffusion to be shared, and one in each of other pixel transistors to be shared. The photodiode is a photoelectric conversion element.

A peripheral circuit includes a vertical drive circuit 4, a column signal processing circuit 5, a horizontal drive circuit 6, an output circuit 7, and a control circuit 8.

The control circuit 8 receives data to execute commands for an input clock, an operation mode, etc., and outputs data such as internal information of the solid-state imaging device 1. More specifically, the control circuit 8 generates a vertical synchronizing signal and a horizontal synchronizing signal and also generates, based on a master clock, a clock signal and a control signal which controls operation of the vertical drive circuit 4, column signal processing circuit 5, and horizontal drive circuit 6. Further, the control circuit 8 inputs these signals to the vertical drive circuit 4, column signal processing circuit 5, and horizontal drive circuit 6.

The vertical drive circuit 4 includes, for example, a shift register, and selects a pixel driving wire, supplies the selected pixel driving wire with a pulse to drive the pixel 2, and drives the pixel 2 in units of rows. More specifically, the vertical drive circuit 4 selectively scans each one of the pixels 2 in a pixel area 3 sequentially in a vertical direction in units of rows, and supplies, via a vertical signal line 9, the column signal processing circuit 5 with a pixel signal based on signal charge generated in accordance with a light receiving amount in the photoelectric conversion element in each of the pixels 2.

The column signal processing circuit 5 is arranged, for example, per column of the pixels 2 and executes, in units of columns of the pixels, signal processing such as noise removal for a signal output from the pixels 2 of one row. More specifically, the column signal processing circuit 5 executes the signal processing such as CDS (Correlated Double Sampling), signal amplification, A/D (Analog/Digital) conversion, etc. in order to remove fixed pattern noise unique to the pixel 2. A horizontal selection switch (not illustrated) is provided at an output stage of the column signal processing circuit 5, being connected on the way to the horizontal signal line 10.

The horizontal drive circuit 6 includes, for example, the shift register, and sequentially outputs a horizontal scan pulse, thereby selecting each one of the column signal processing circuits 5 in order, and causing each one of the column signal processing circuits 5 to output the pixel signal to the horizontal signal line 10.

The output circuit 7 executes signal processing for the signal sequentially supplied from each one of the column signal processing circuits 5 via the horizontal signal line 10 and outputs the signal. The output circuit 7 may execute, for example, only buffering, or may execute black level adjustment, column variation correction, various kinds of digital signal processing, and so on.

An input and output terminal 12 is provided to exchange signals with components or devices.

<Exemplary Configuration of Pixel>

Figure 2:
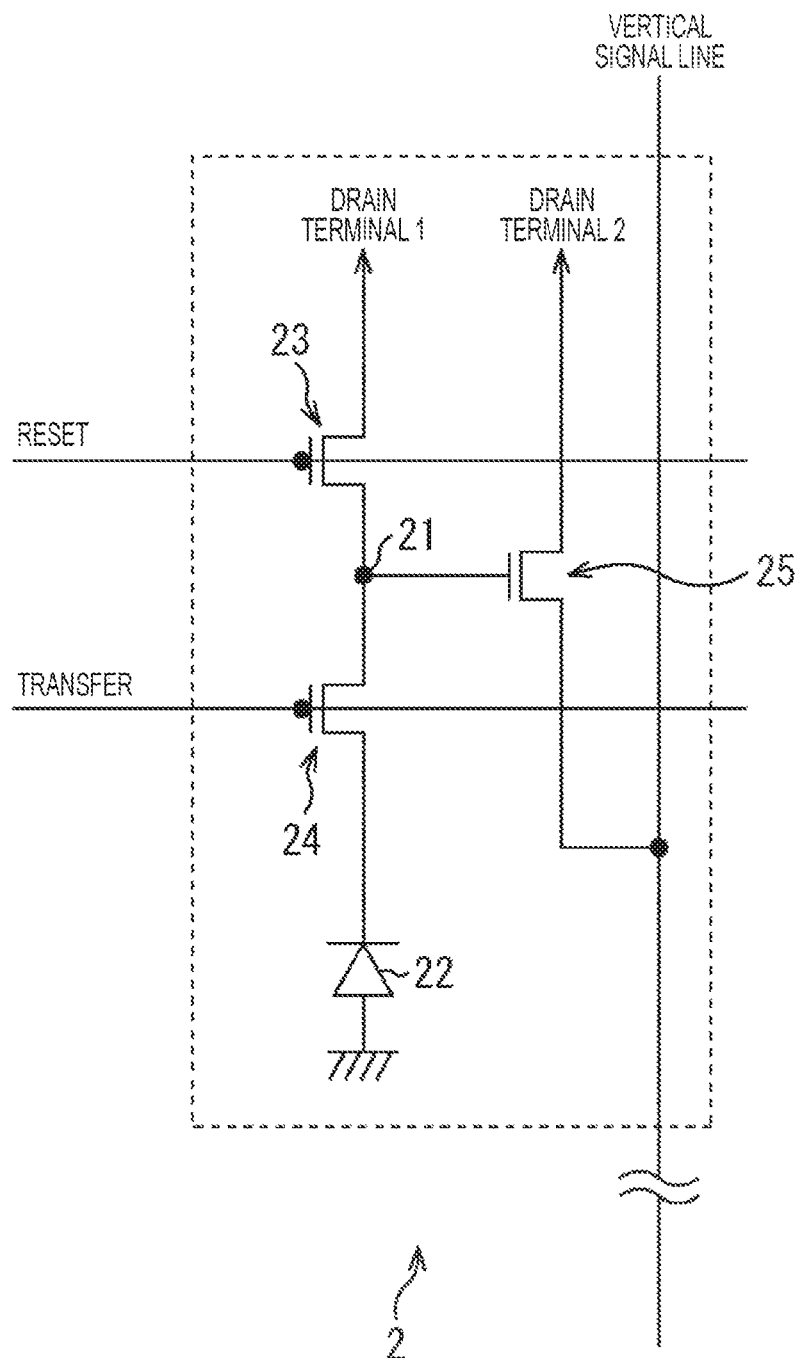
FIG. 2 is a circuit diagram illustrating an exemplary configuration of a pixel including three transistors.

FIG. 2 is a diagram illustrating an exemplary configuration of a pixel in a global shutter type CMOS sensor. In the example in FIG. 2, the exemplary configuration including three transistors (hereinafter referred to as Tr.) is illustrated (hereinafter also referred to 3-Tr. type).

The pixel 2 in FIG. 2 includes one floating diffusion to be shared (hereinafter referred to as FD) 21, a photodiode 22, and three shared or pixel transistors inside a unit pixel. The three shared Trs. are a reset Tr. 23, a transfer Tr. 24, and an amplification Tr. 25 respectively.

The photodiode 22 has an anode electrode connected to a negative side power source (e.g., ground), and photoelectrically converts received light to photo-charge (photoelectron, in this case) in accordance with a light amount. The photodiode 22 has a cathode electrode electrically connected to a gate electrode of the amplification Tr. 25 via a transfer Tr. 24. A node electrically connected to the gate electrode of the amplification Tr. 25 and the transfer Tr. 24 is the FD 21.

The transfer Tr. 24 is connected between the cathode electrode of the photodiode 22 and the FD 21. A transfer pulse (pTRF having an active high level (e.g., VDD level) (hereinafter referred to as high active) is received by the gate electrode of the transfer Tr. 24 via a transfer line not illustrated. By receiving the transfer pulse φTRF, the transfer Tr. 24 becomes an ON state, and transfers the photo-charge which has been photoelectrically converted at the photodiode 22 to the FD 21.

The reset Tr. 23 has a drain electrode connected to the pixel power source VDD, and a source electrode connected to the FD 21 respectively. A high active reset pulse φRST is received by a gate electrode of the reset Tr. 23 via a reset line (not illustrated) before transference of signal charge from the photodiode 22 to the FD 21. By receiving the reset pulse φRST, the reset Tr. 23 is placed in an ON state, and discharges the electric charge of the FD 21 to the pixel power source VDD, thereby resetting the FD 21.

The amplification Tr. 25 has a gate electrode connected to the FD 21, a drain electrode connected to the pixel power source VDD, and a source electrode connected to the vertical signal line. Also, the amplification Tr. 25 outputs, as a reset signal (reset level) Vreset, a potential of the FD 21 which has been reset by the reset Tr. 23. Further, the amplification Tr. 25 further outputs, as a light accumulation signal (signal level) Vsig, the potential of the FD 21 after the signal charged is transferred by the transfer Tr. 24.

Figure 3:
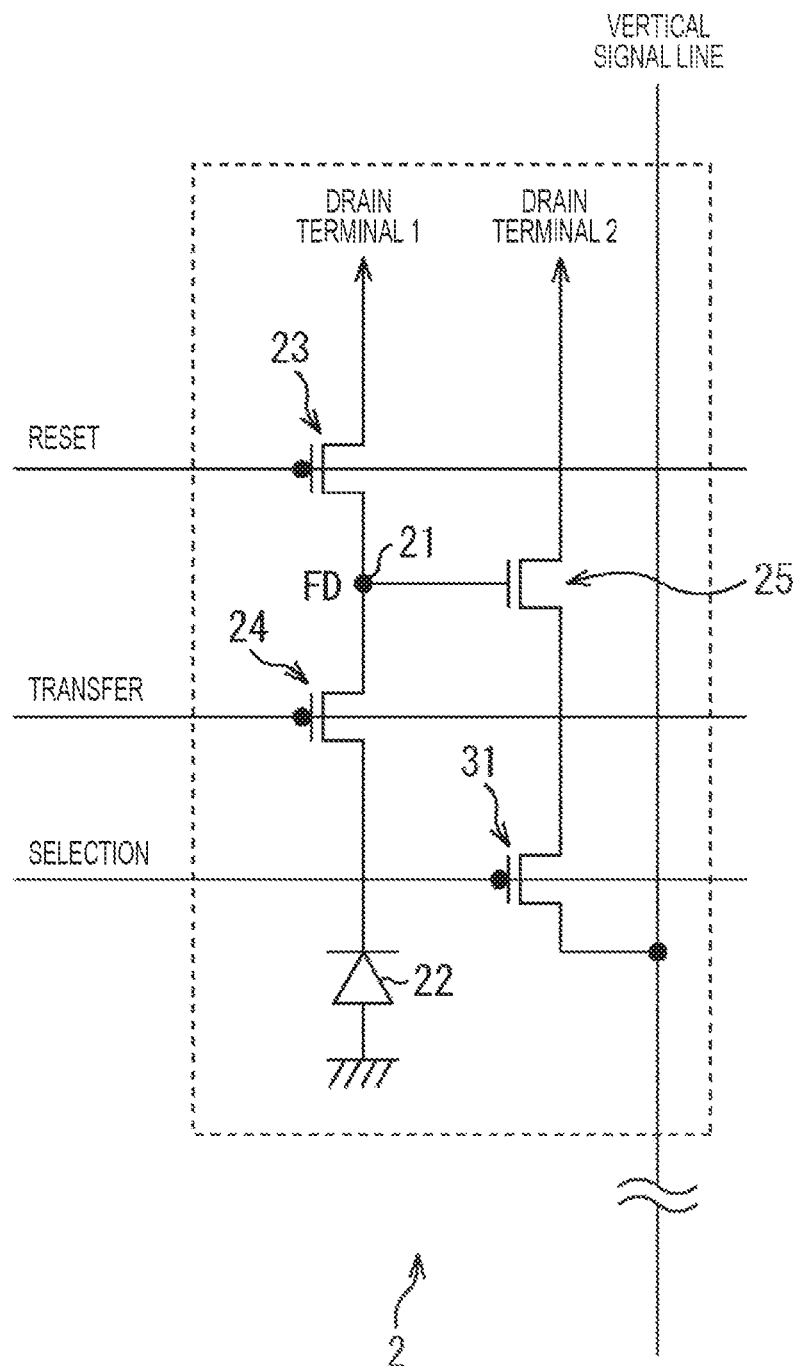
FIG. 3 is a circuit diagram illustrating an exemplary configuration of a pixel including four transistors.

FIG. 3 is a diagram illustrating a different configuration of the pixel in the global shutter type CMOS sensor. In the example in FIG. 3, the exemplary configuration of four Trs. (hereinafter also referred to as 4-Tr. type) is illustrated.

A pixel 2 in FIG. 3 is similar to the pixel 2 in FIG. 2 in that both pixels 2 include the FD 21, photodiode 22, reset Tr. 23, transfer Tr. 24, and amplification Tr. 25. The pixel 2 in FIG. 3 differs from the pixel 2 in FIG. 2 that a selection Tr. 31 is added.

The selection Tr. 31 has a drain electrode connected to a source electrode of the amplification Tr. 25, and a source electrode connected to the vertical signal line respectively, for example. A high active selection pulse φSEL is received by the gate electrode of the selection Tr. 31 via a selection line not illustrated. By receiving the selection pulse φSEL, the selection Tr. 31 enters an ON state and places a unit pixel in a selected state, thereby relaying a signal output from the amplification Tr. 25 to the vertical signal line.

Meanwhile, the selection Tr. 31 may be connected between the pixel power source VDD and the drain of the amplification Tr. 25 as well.

<Exemplary Structure of Pixel Sharing>

Figure 4:
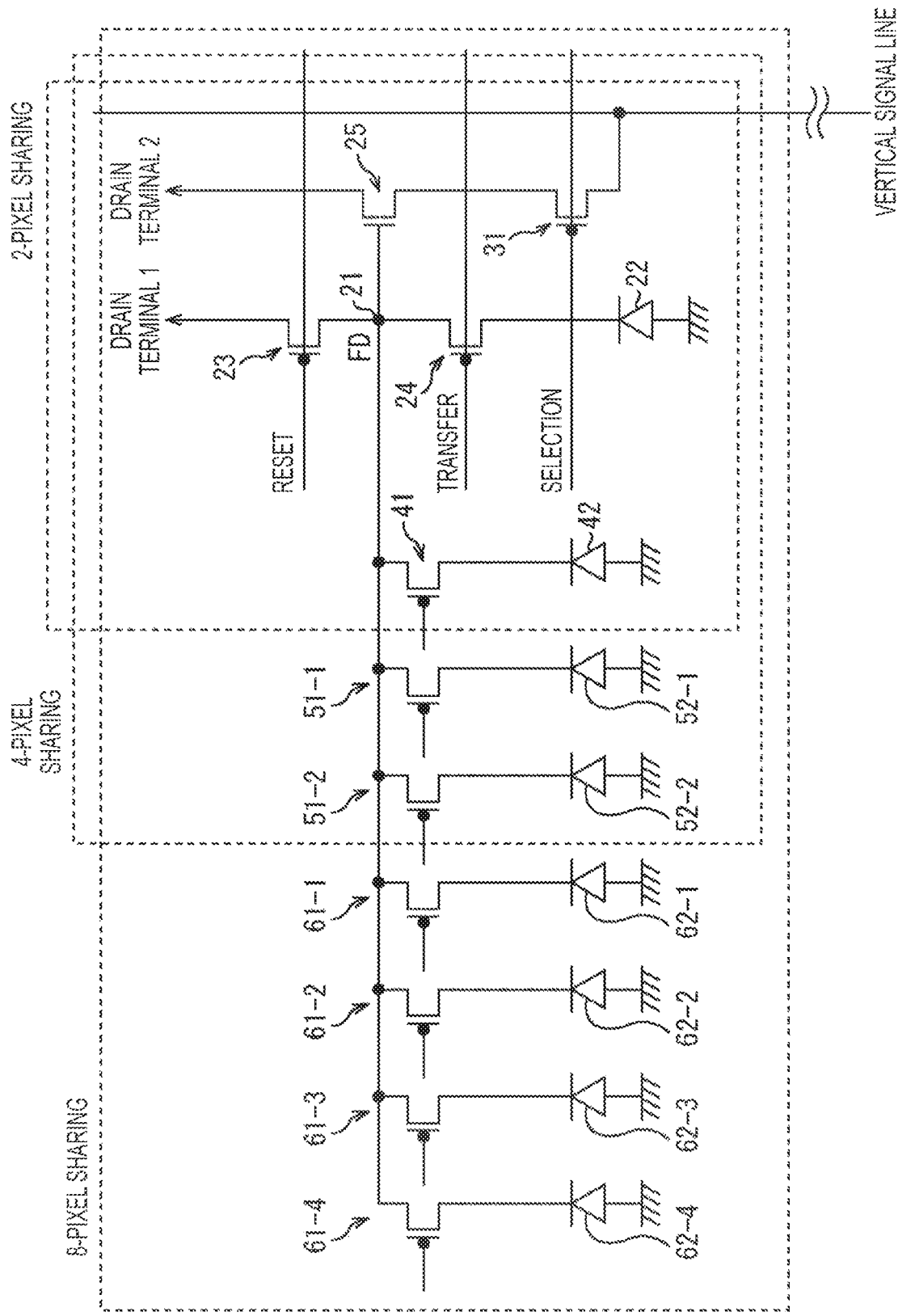
FIG. 4 is a circuit diagram illustrating an exemplary configuration of a pixel having a shared pixel structure.

FIG. 4 is a diagram illustrating a structure where one set of Trs. is shared by two pixels, four pixels, and eight pixels. The set of Trs. includes the reset Tr. 23 and amplification Tr. 25 described above with reference to FIG. 2, or the reset Tr. 23, amplification Tr. 25, and selection Tr. 31 described with reference to FIG. 3. In both cases, a transfer Tr. is required for each photodiode, and is directly connected to each photodiode.

More specifically, in the case of 2-pixel sharing, a pair of the transfer Tr. 41 and the photodiode 42 is added to the configuration of the pixel 2 in FIG. 3 via the FD 21. In other words, in this case, one set of Trs. is configured to be shared by the two pixels (photodiode 22 and photodiode 42).

In the case of 4-pixel sharing, two pairs of transfer Trs. 51-1, 51-2 and photodiodes 52-1, 52-2 are further added to the above-described 2-pixel sharing structure via the FD 21. In other words, in this case, one set of Trs. is configured to be shared by four pixels (photodiode 22, photodiode 42, photodiodes 52-1 and 52-2).

In the case of 8-pixel sharing, four pairs of transfer Trs. 61-1 to 61-4, photodiodes 62-1 to 62-4 are further added to the above-described 4-pixel sharing structure via the FD 21. In other words, in this case, one set of Trs. is configured to be shared by eight pixels (photodiode 22, photodiode 42, photodiodes 52-1, 52-2, and photodiodes 62-1 to 62-4).

First Embodiment

<Exemplary Configuration of Solid-State Imaging Device According to Present Technology>

Figure 5:
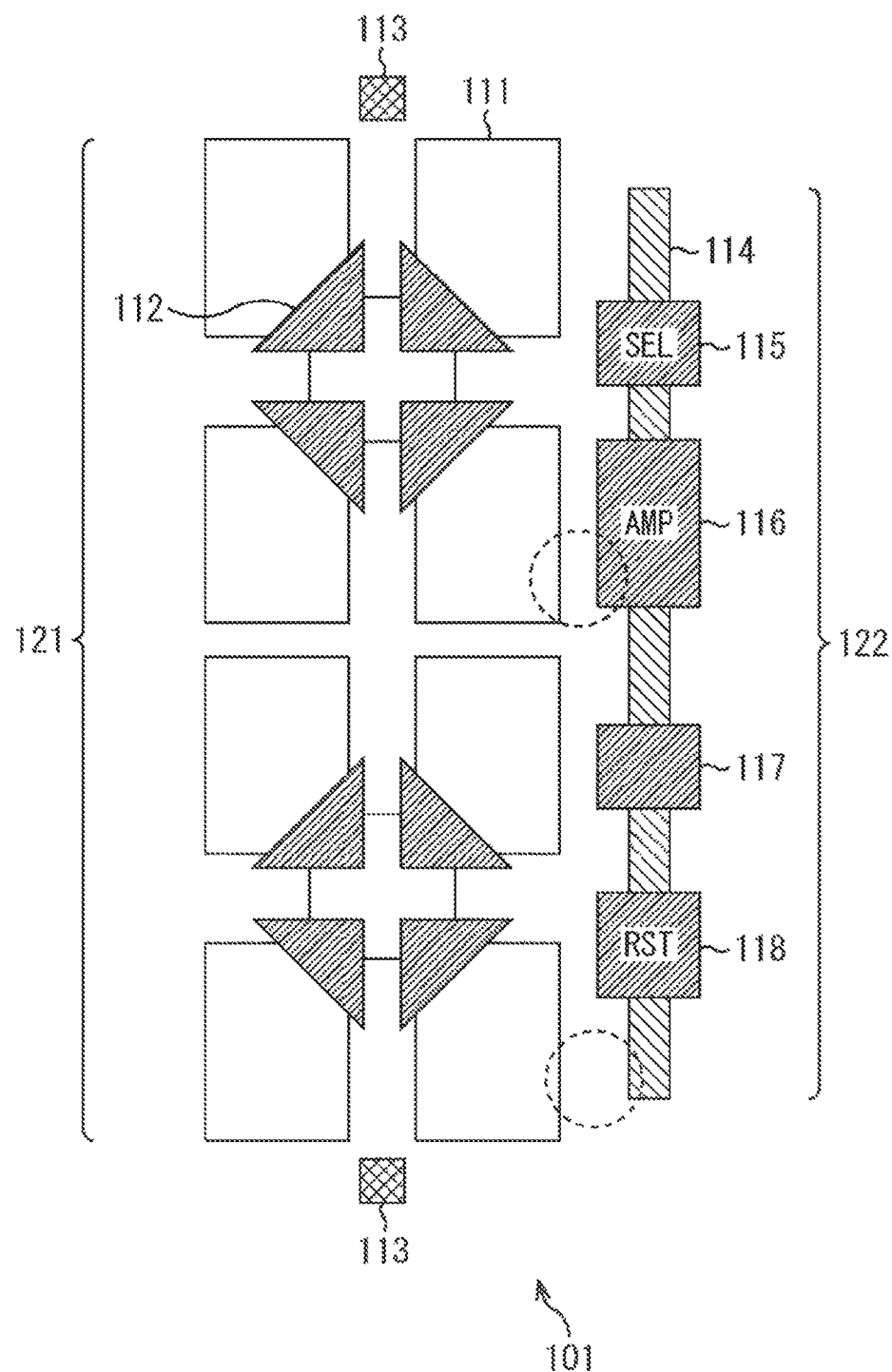
FIG. 5 is a diagram illustrating a first exemplary configuration of a solid-state imaging device to which the present technology is applied.

FIG. 5 is a diagram illustrating an exemplary configuration of a solid-state imaging device to which the present technology is applied. In the example in FIG. 5, a case in which the solid-state imaging device includes a backside illumination type CMOS sensor of 4-Tr. type, 8-pixel sharing (2×4 pixels) is illustrated.

Generally, the 4-Tr. type has one area where three transistors including a reset Tr. (RST), an amplification Tr. (AMP), and a selection Tr. (SEL) described above are arranged besides a photodiode area where photodiodes are arranged. Further, it is assumed that the transfer Tr. is arranged in the photodiode area because the transfer Tr. is directly connected to the photodiode.

In a solid-state imaging device 101 in FIG. 5, 2×4 pixels of photodiodes 111 which is a pixel sharing unit, and 2×4 pixels of transfer Trs. 112 are arranged as a PD group 121 in the photodiode area on the left side of the drawing.

In the PD group 121, the 2×4 pixels of photodiodes 111 and the 2×4 pixels of transfer Trs. 112 of are arranged such that every 4 pixels are arrayed in two steps in a vertical direction of the drawing so as to form a vertically long rectangle.

On the other hand, in the solid-state imaging device 101, a selection Tr. 115, an amplification Tr. 116, a dummy Tr. 117, and a reset Tr. 118, which are directly connected to a source drain 114, are arranged as one Tr. group 122 in an area other than the photodiode on the right side of the drawing.

In other words, the pixels Tr. including the selection Tr. 115, amplification Tr. 116, dummy Tr. 117, and reset Tr. 118 are arranged as one Tr. group 122 on a side of a long side of one PD group 121 including the 2×4 pixels of photodiodes 111.

With this arrangement, an L-length of the amplification Tr. 116 can be elongated (at least longer than other Trs.), thereby achieving improved RN (random noise) performance. Note that the long side of the amplification Tr. is not necessarily equal to the L-length although the L-length direction is generally longer in the amplification Tr. in a viewpoint of RN and the L length is the long side in the present embodiment as well. In other words, the L-length represents a length of a direction linking the source-drain.

Meanwhile, not only the amplification Tr. 116 but also the selection Tr. 117 may have the L-length elongated. In the case of elongating the L-length of the selection Tr., a short channel effect may be reduced and a robust random noise margin may be obtained.

Further, the respective pixels Trs. of the Tr. group 122 are arranged so as to be positionally symmetric with respect to the respective photodiodes 111 of the PD group 121 (i.e., optically symmetric with respect to photodiodes).

More specifically, as indicated by dashed line circles, the amplification Tr. 116 is positioned beside the photodiode 111 at a lower right of upper-side 4 pixels, but there is no Tr. beside the photodiode 111 at the lower right of lower-side 4 pixels. Therefore, optical property may change due to difference of polysilicon density despite having a same color (e.g., green).

Considering this, in the solid-state imaging device 101, the dummy Tr. 117 which is a dummy of the reset Tr. 118 is provided, and two reset Trs. are provided in the Tr. group 122. More specifically, the selection Tr. 115 and amplification Tr. 116 are provided near the transfer Tr. 112 on the upper-side 4 pixels, and the dummy Tr. 117 and reset Tr. 118 are provided near the transfer Tr. 112 on the lower-side 4 pixels. Note that the dummy Tr. 117 is not necessarily driven as the Tr. In other words, the dummy Tr. 117 may be driven, or may just be provided without being driven.

Thus, symmetry can be improved because layout substantially equivalent (sizes of gate, source, and drain) to the side of the selection Tr. 115 and amplification Tr. 116 can be obtained in the Tr. group 122 by the dummy Tr. 117 and reset Tr. 118 illustrated at the lower side of the drawing. With this structure, influence caused by the difference of polysilicon density between Trs. can be reduced, and PRNU (photo response non uniformity: sensitivity ununiformity) can be improved in the solid-state imaging device 101.

Note that the dummy Tr. 117 is not limited to the dummy of the reset Tr. 118, and may be a dummy for other Trs.

Further, in the solid-state imaging device 101, a well contact 113 is arranged between the PD group 121 and other PD groups 121 not illustrated but arranged on upper and lower sides of the drawing. With this arrangement, an area for the additional Tr. can be effectively secured. Note that an interval at which the PD groups 121 are arranged will be referred to as a pitch of the PD group 121 hereinafter.

Further, since the well contact 113 influences various kinds of pixel characteristics (especially dark current), the difference between the pixels can be suppressed by arranging the well contact between the PD group 121 and other PD groups 121 arranged on the upper and lower sides of the drawing. In other words, the difference between the pixels can be small because the well contacts are positioned at equal intervals from all of the PDs by arranging the well contact 113 as described above.

Figure 6:
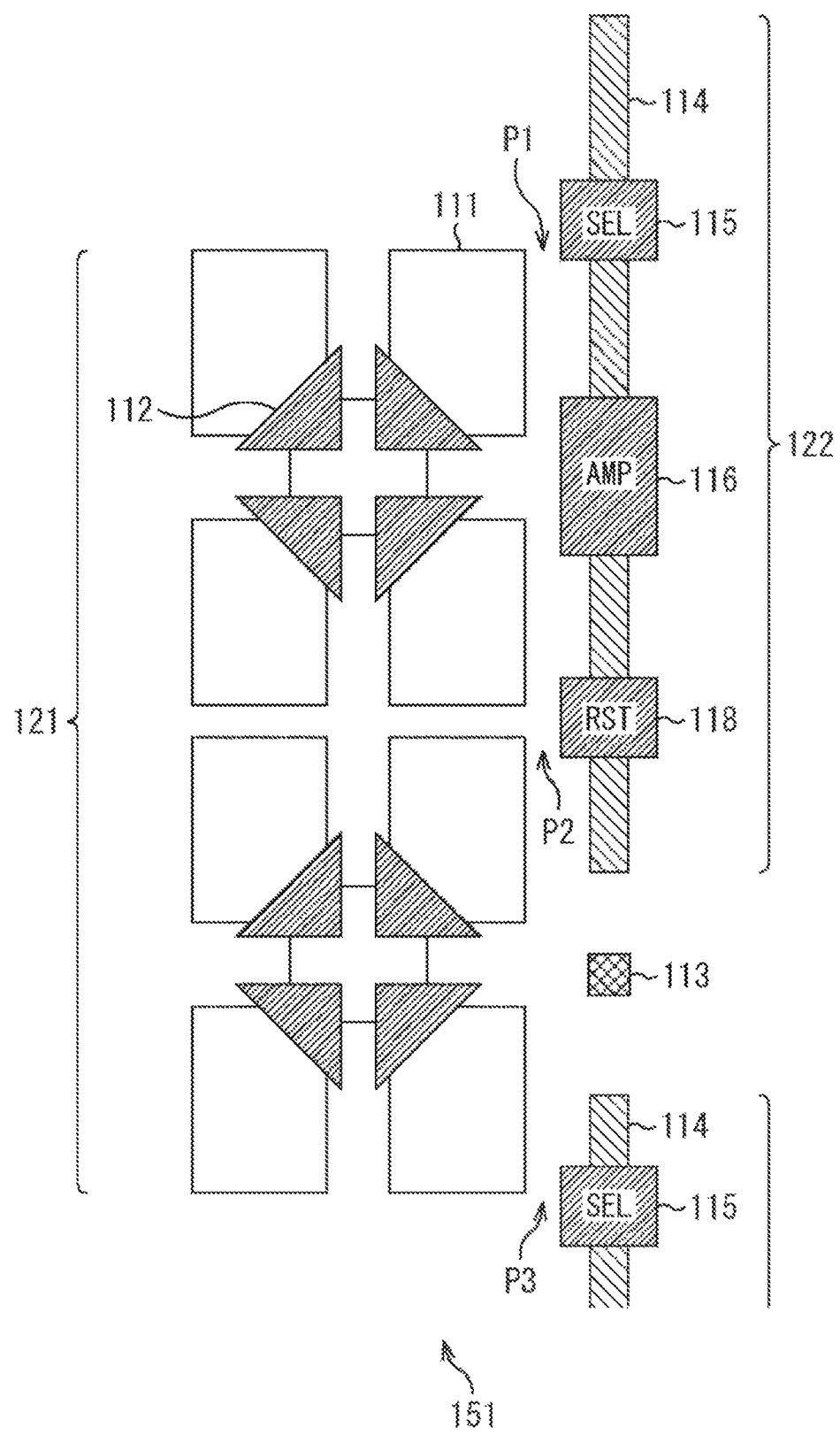
FIG. 6 is a diagram illustrating a different arrangement example of transistors.

Further, in the case where symmetry of polysilicon of the Trs. is high, it may be unnecessary to provide the additional dummy Tr. as a countermeasure against PRNU as illustrated in next FIG. 6.

<Other Examples of Tr. Arrangement>

FIG. 6 is a diagram illustrating an exemplary arrangement of the photodiodes and Trs. in the solid-state imaging device to which the present technology is applied.

In a solid-state imaging device 151 in FIG. 6, the Tr. group 122 is arranged on the side of the long side of one PD group 121 including 2×4 pixels of photodiodes 111 in the same manner as the solid-state imaging device 101 in FIG. 5. Therefore, as shown by the L-length of the amplification Tr. 116, the L-length of an existing Tr. can be elongated, thereby achieving improved RN (random noise) performance.

On the other hand, the solid-state imaging device 151 in FIG. 6 differs from the solid-state imaging device 101 in FIG. 5 in that the dummy Tr. 117 is excluded from the Tr. group 122 and an arrangement position of the Tr. group 122 with respect to the PD group 121 is different.

More specifically, in the Tr. group 122, the amplification Tr. 116 is arranged beside the 4 pixels of transfer Trs. 112 on the upper side of the drawing, and the selection Tr. 115 and the reset Tr. 118 are arranged at corners of the 4 pixels of photodiodes 111 on a side where no transfer Tr. 112 is provided on the upper side of the drawing as indicated by arrows P1 and P2. Additionally, as indicated by an arrow P3, the selection Tr. 115 of the Tr. group 122 corresponding to another PD group 121 arranged below the PD group 121 is also arranged at the corner of the 4 pixels of photo diodes 111 on the side where no transfer Tr. 112 is provided on the lower side of the drawing.

Further, with this arrangement, the Tr. group 122 is arranged entirely shifted to the upper side of the drawing with respect to the position of the PD group 121. In the example of FIG. 5, the position of the PD group 121 and the position of the Tr. group 122 are aligned. In contrast, in the example of FIG. 6, Tr. group 122 is shifted upward by the length of the long side of one photodiode 111 with respect to a rectangular shaped sharing unit of the PD group 121. Note that a shifted amount is not limited to the length of the long side of the one photodiode 111. The same shall apply hereinafter.

Further, the well contact 113 is arranged beside the 4 pixels of transfer Trs. 112 on the lower side of the drawing in order to improve symmetry between the upper and lower 4 pixels of photodiodes 111 in the solid-state imaging device 151 of FIG. 6. Note that the amplification Tr. 116 and the well contact 113 are not necessarily positioned right beside the 4 pixels of transfer Trs. 112 respectively, and in the case of being positioned in the vicinity of right beside the transfer Tr. 112, an effect of symmetry improvement can be expected.

As described above, in the solid-state imaging device 151 of FIG. 6, PRNU can be improved without providing the dummy Tr. because symmetry with respect to the photodiodes 111 of the PD group 121 is achieved just by arranging one in each of the reset Tr., amplification Tr., and selection Tr. in the Tr. group 122.

Meanwhile, since no well contact 113 is provided between the PD groups 121 in the solid-state imaging device 151 of FIG. 6, different from the solid-state imaging device 101 of FIG. 5, influence caused by the difference between the pixels may remain. In such a case, the well contact 113 may be arranged between the PD groups 121 in the same manner as the example in FIG. 5.

Figure 7:
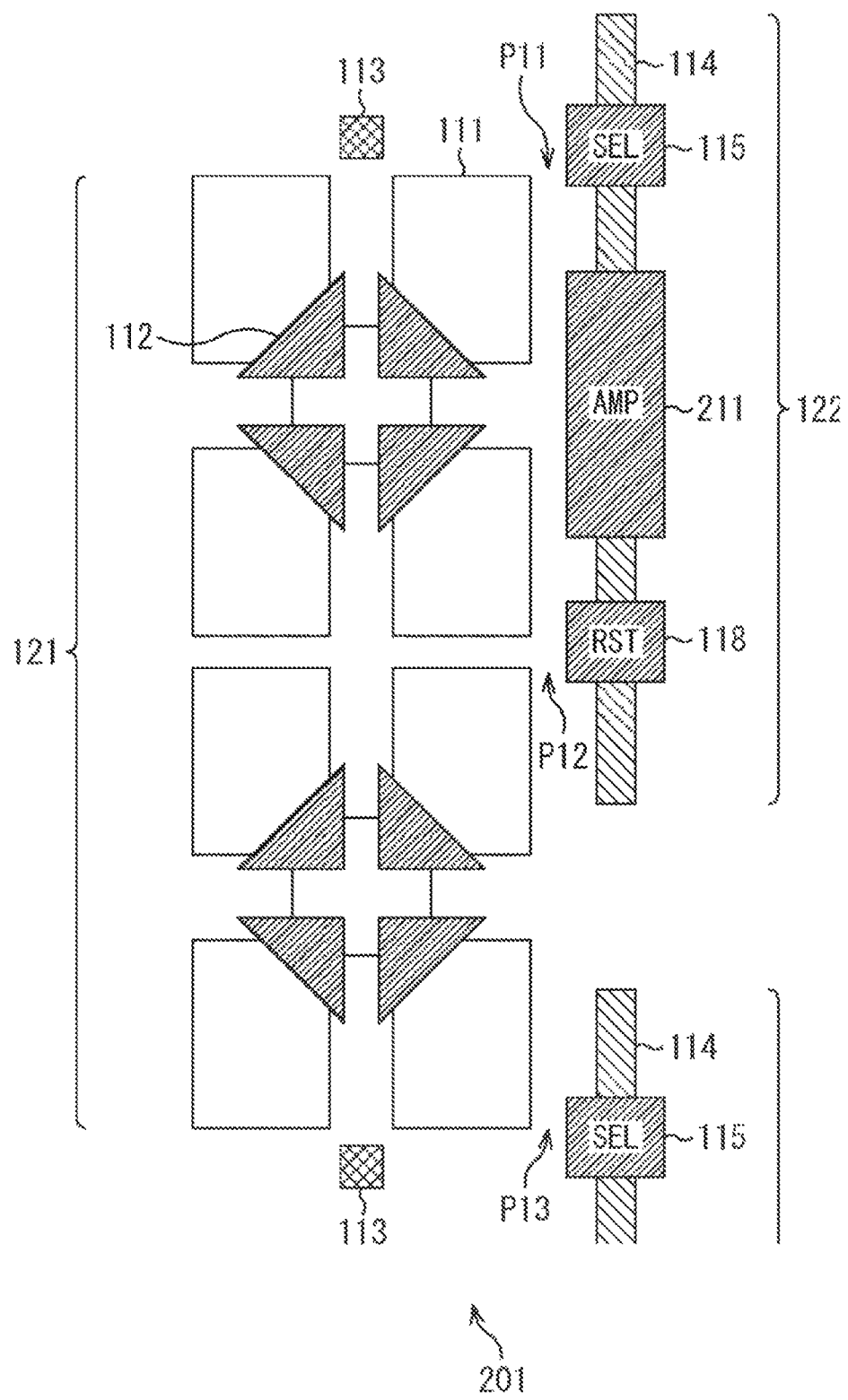
FIG. 7 is a diagram illustrating another different arrangement example of the transistors.

Moreover, as illustrated in FIG. 7, the positions of the respective Trs. of the Tr. group 122 may be arranged in accordance a layout whereby both PRNU and RN can be improved.

A solid-state imaging device 201 in FIG. 7 differs from the solid-state imaging device 151 in FIG. 6 in that the amplification Tr. 116 is replaced by an amplification Tr. 211 having the L-length elongated at a maximum in the Tr. group 122.

In other words, in the solid-state imaging device 201 of FIG. 7, the L-length of the amplification Tr. 211 in the Tr. group 122 is larger than the L-length of the amplification Tr. 116 in FIG. 6.

Due to this, in the solid-state imaging device 201 of FIG. 7, the Tr. group 122 is arranged along the long side of the PD group 121 including the 2×8 pixels of photodiodes 111, in the same manner as the solid-state imaging device 101 in FIG. 5. Therefore, RN (random noise) performed can be improved because the L-length of an existing Tr. can be elongated as shown by the L-length of the amplification Tr. 211.

More specifically, in the Tr. group 122, the amplification Tr. 211 is arranged beside the 4 pixels of transfer Trs. 112 on the upper side of the drawing, and further as indicated by arrows P11 and P12, the selection Tr. 115 and reset Tr. 118 are arranged at the corners of the 4 pixels of photodiodes 111 on the side where no transfer Tr. 112 is arranged on the upper side of the drawing. Additionally, as indicated by an arrow P13, the selection Tr. 115 of the Tr. group 122 corresponding to another PD group 121 (not shown) arranged below the illustrated PD group 121 is also arranged at the corner of the 4 pixels of the photodiodes 111 on the side where no transfer Tr. 112 is arranged on the lower side of the drawing.

Note that, in this case also, the Tr. group 122 is arranged entirely shifted upward in the drawing with respect to the position of the PD group 121.

As described above, since the L-length of the amplification Tr. is elongated at a maximum without providing the dummy Tr. in the solid-state imaging device 201 of FIG. 7, RN margin can be improved. Moreover, since the selection Tr. 115 and reset Tr. 118 are arranged to be symmetric with respect to the photodiodes, PRNU can be improved.

Further, in the solid-state imaging device 201 of FIG. 7, the well contact 113 is arranged between the PD group 121 and another PD group 121 not illustrated but arranged on the lower side of the drawing in the same manner as the solid-state imaging device 101 in FIG. 5.

Therefore, the difference between the pixels can be suppressed in the solid-state imaging device 201 of FIG. 7, in a similar way as the solid-state imaging device 101 in FIG. 5. Meanwhile, in the case where an element isolation width between the PD and the PD can be reduced and the well contact 113 cannot be arranged between the PD and PD, the Tr. group 122 can be arranged in the same manner as the example in FIG. 6.

Figure 8:
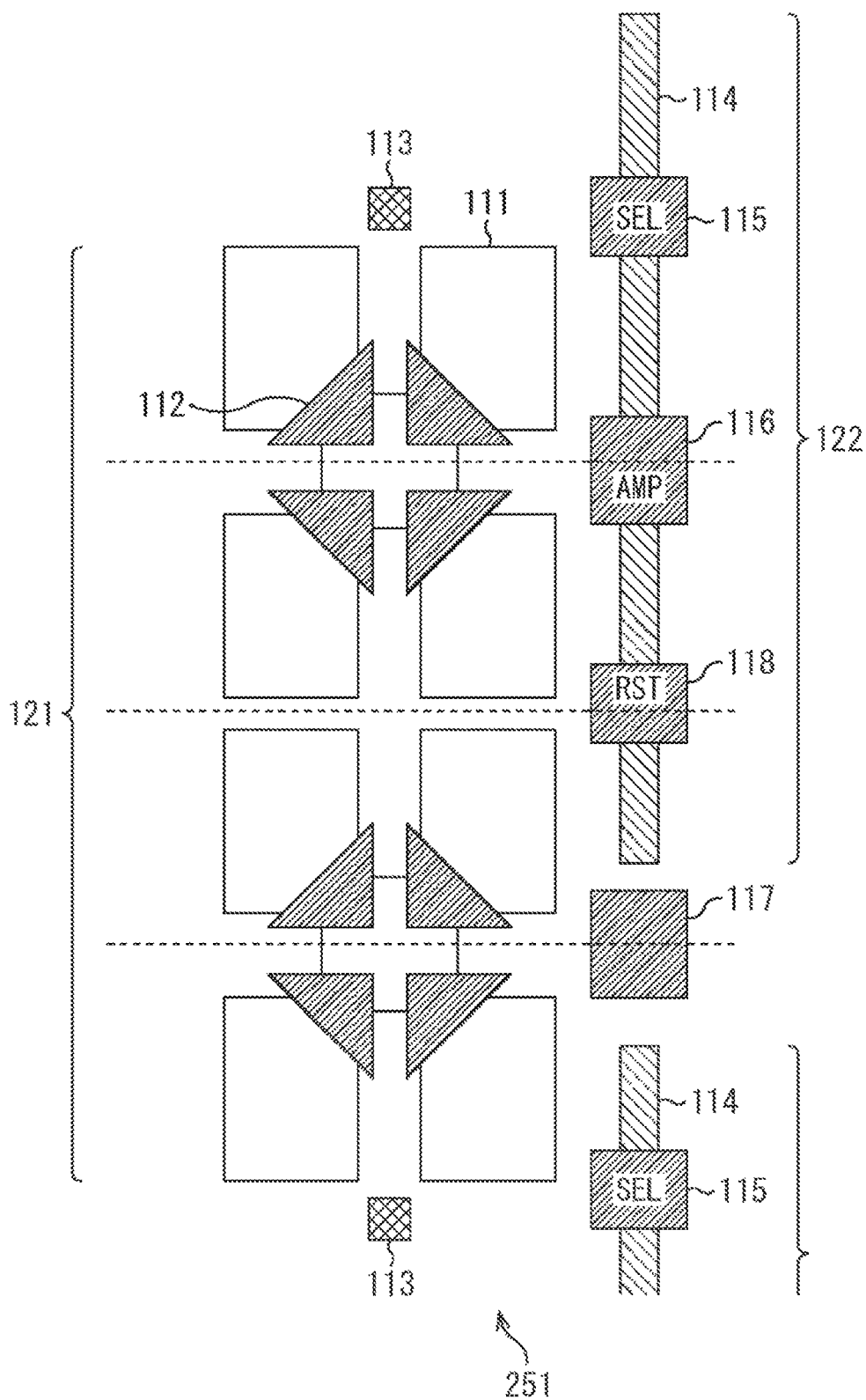
FIG. 8 is a diagram illustrating still another different arrangement example of the transistors.

Further, as a layout having the highest symmetry, the polysilicon of the Trs. is arranged substantially uniformly with respect to the arrangement of the photodiodes 111 of the PD group 121 as illustrated in FIG. 8, thereby achieving to improve PRNU.

More specifically, in a solid-state imaging device 251 of FIG. 8, the selection Tr. 115 of the Tr. group 122 is arranged beside the well contact 113 arranged on the upper side of the PD group 121 in the drawing. Further, the amplification Tr. 116 is arranged beside the 4 pixels of transfer Trs. 112 in the PD group 121 on the upper side of the drawing, and the reset Tr. 118 is arranged between the 4 pixels of photodiodes 111 and the 4 pixels of photodiodes 111 in the PD group 121.

Additionally, the dummy Tr. 117 is arranged beside the 4 pixels of transfer Trs. 112 in the PD group 121 on the lower side of the drawing.

As described above, in the solid-state imaging device 251 of FIG. 8, the polysilicon of Trs. are arranged more uniformly with respect to the arrangement of the photodiodes of the PD group 121. In this case, the L-length of the amplification Tr. 116 cannot be elongated, compared to the solid-state imaging device 101 in FIG. 5. Therefore, RN performance cannot be improved, but PRNU can be improved most. Further, since the well contact 113 is arranged between the PD group and PD group in the same manner as the solid-state imaging device 101 in FIG. 5, the difference of the pixel characteristics between the pixels can be minimized. Note that the dummy Tr. 117 is not necessarily provided. More specifically, since the density of polysilicon is already high in the periphery of the transfer Tr. 112, the polysilicon beside the transfer Tr. 112 may not influence PRNU. In this case, the layout without having the dummy Tr. 117 may also be an option.

Second Embodiment

<Exemplary Configuration of Solid-State Imaging Device According to Present Technology>

Figure 9:
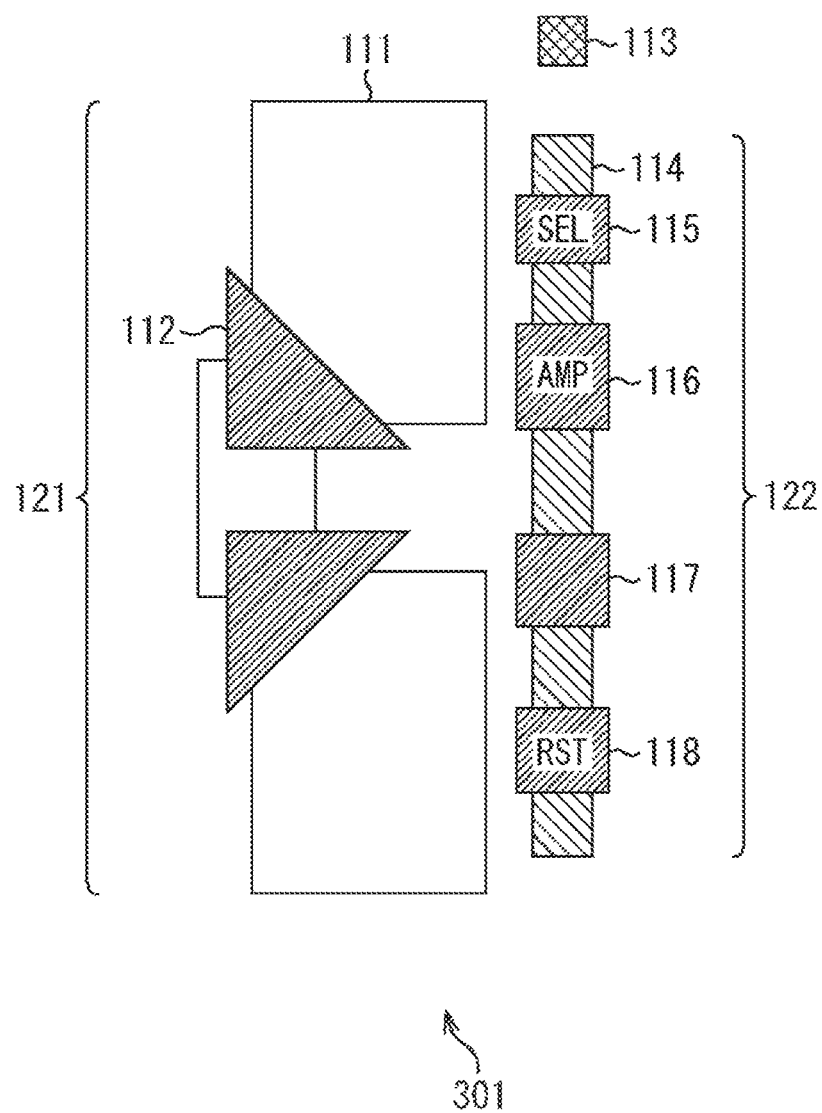
FIG. 9 is a diagram illustrating a second exemplary configuration of the solid-state imaging device to which the present technology is applied.

FIG. 9 is a diagram illustrating another exemplary configuration of a solid-state imaging device to which the present technology is applied. In the example in FIG. 9, a case in which the solid-state imaging device includes a backside illumination type CMOS sensor of 4-Tr. type, 2-pixel sharing (1×2 pixels). Note that the example in FIG. 9 is a case in which the layout described in FIG. 5 is applied to the 2-pixel sharing.

In a solid-state imaging device 301 of FIG. 9, 1×2 pixels of photodiodes 111 adopting a pixel sharing structure and 1×2 pixels of transfer Trs. 112 corresponding thereto are arranged so as to form a vertically long rectangle as a PD group 121 in a photodiode area on a left side of the drawing.

Further, pixel Trs. including a selection Tr. 115, an amplification Tr. 116, a dummy Tr. 117, and a reset Tr. 118 are arranged as a Tr. group 122 on a side of a long side of the PD group 121. The respective pixel Trs. of the Tr. group 122 are arranged so as to be symmetric with respect to the respective photodiodes 111 of the PD group 121.

More specifically, in the Tr. group 122 of FIG. 9, the selection Tr. 115 is arranged in the vicinity of a center of the upper photodiode 111 of the PD group 121, and the reset Tr. 118 is arranged in the vicinity of a center of the lower photodiode 111 of the PD group 121 so as to be symmetric therewith.

In the same manner, in the Tr. group 122 of FIG. 9, the amplification Tr. 116 is arranged in the vicinity of the upper transfer Tr. 112 of the PD group 121, and the dummy Tr. 117 is arranged in the vicinity of the lower transfer Tr. 112 of the PD group 121 so as to be symmetric therewith.

As described above, in the case of 2-pixel sharing also, the same effects as with 8-pixel sharing described above with reference to FIG. 5 can be obtained. More specifically, RN (random noise) performance can be improved because the L-length of the amplification Tr. can be elongated by being arranged as a Tr. group 122 on the side of the long side of the PD group 121. Further, since the symmetry of the polysilicon of the Tr. with respect to the photodiodes is high, PRNU can be improved.

Meanwhile, in the case of the solid-state imaging device 301 in FIG. 9, a well contact 113 is arranged between the Tr. group 122 and another Tr. group 122 positioned above, but may also be arranged between the PD and the PD as in an example shown in FIG. 8.

Third Embodiment

<Exemplary Configuration of Solid-State Imaging Device According to Present Technology>

Figure 10:
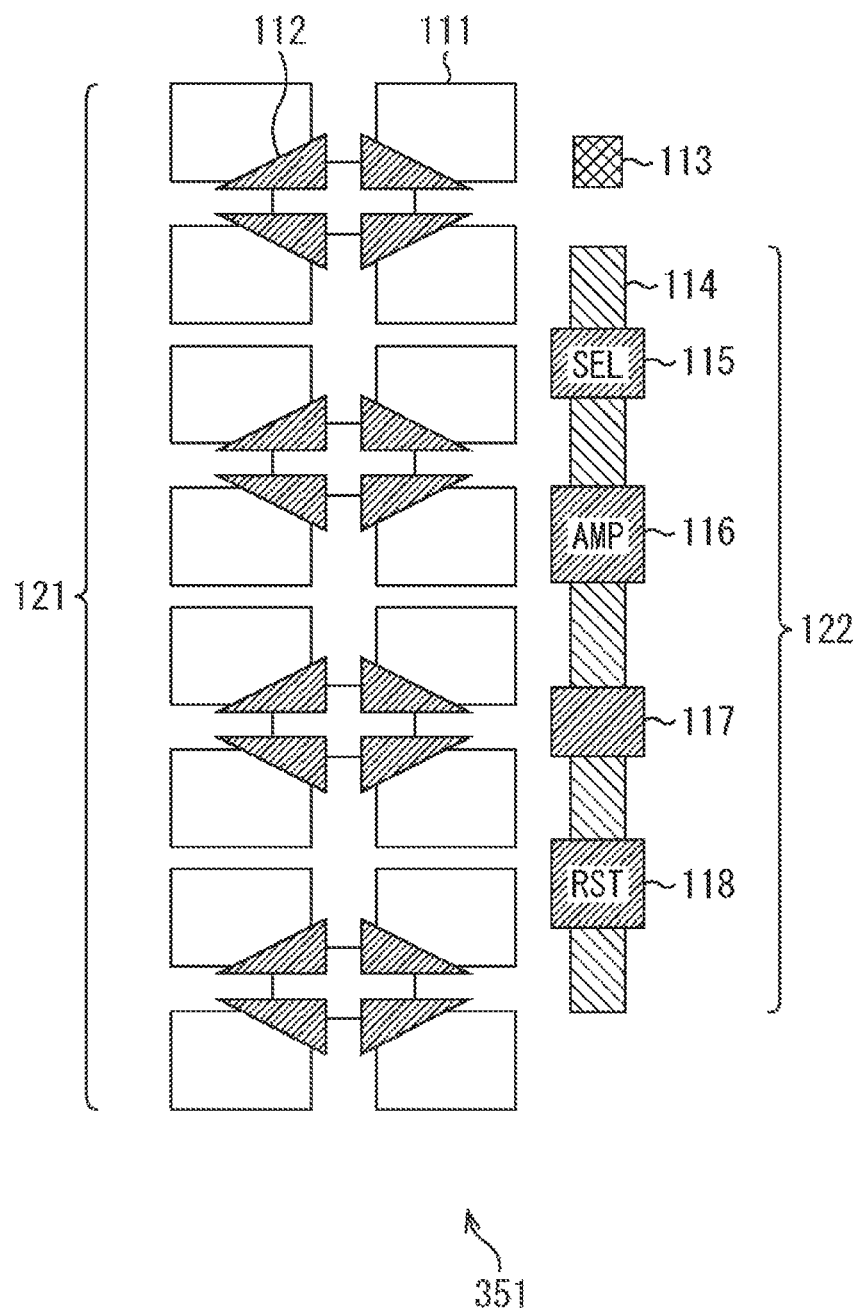
FIG. 10 is a diagram illustrating a third exemplary configuration of the solid-state imaging device to which the present technology is applied.

FIG. 10 is a diagram illustrating another exemplary configuration of a solid-state imaging device to which the present technology is applied. In the example in FIG. 10, a case in which the solid-state imaging device includes a backside illumination type CMOS sensor of 4-Tr. type, 16-pixel sharing (2×8 pixels). Note that the example in FIG. 10 is the case in which the layout described in FIG. 5 is applied to the 16-pixel sharing.

In a solid-state imaging device 351 of FIG. 10, 2×8 pixels of photodiodes 111 adopting a pixel sharing structure and 2×8 pixels of transfer Trs. 112 corresponding thereto are arranged as one PD group 121 in the photodiode area on a left side of the drawing.

In the PD group 121, the 2×8 pixels of photodiodes 111 and the 2×8 pixels of transfer Trs. 112 are arranged so as to form a vertically long rectangle, and every 4 pixels are arrayed in four steps in a vertical direction of the drawing.

Further, pixel Trs. including a selection Tr. 115, an amplification Tr. 116, a dummy Tr. 117, and a reset Tr. 118 are arranged as one Tr. group 122 on a side of a long side of the PD group 121 (right side in the drawing). Additionally, a well contact 113 is arranged on an upper side of the Tr. group 122 in the drawing. The well contact 113 and the respective pixel Trs. of the Tr. group 122 are arranged so as to be symmetric with respect to the respective photodiodes 111 of the PD group 121.

More specifically, in the example in FIG. 10, the well contact 113 is arranged in the vicinity of right beside the 4 pixels of transfer Trs. 112 in a first step from the top of the drawing. In the Tr. group 122, the selection Tr. 115 is arranged in the vicinity of a position opposite to the transfer Trs. 112 of the 4 pixels of photodiodes 111 in a second step from the top of the drawing in the PD group 121.

In the Tr. group 122, the amplification Tr. 116 is arranged in the vicinity of positions of the transfer Trs. 112 of the 4 pixels of photodiodes 111 in the second step from the top of the drawing in the PD group 121. In the Tr. group 122, the dummy Tr. 117 is arranged in the vicinity of the positions of the transfer Trs. 112 of the 4 pixels of photodiodes 111 in a third step from the top of the drawing in the PD group 121. The reset Tr. 118 is arranged in the vicinity of a position opposite to the transfer Trs. 112 of the photodiodes 111 in a fourth step from the top of the drawing in the PD group 121.

As described above, in the case of 16-pixel sharing also, effects same as 8-pixel sharing described above with reference to FIG. 5 can be obtained. More specifically, in the solid-state imaging device 351 of FIG. 10, an L-length of an existing Tr. can be elongated as shown by the L-length of an amplification Tr. 116 because the Tr. group 122 is arranged on a side of a long side of one PD group 121 including 2×8 pixels of the photodiodes 111 in the same manner as the solid-state imaging device 101 in FIG. 5. With this configuration, RN performance can be improved. Further, since the symmetry of the polysilicon of the Trs. with respect to the photodiodes is high, PRNU can be improved.

However, in the case of solid-state imaging device 351 in FIG. 10 also, the well contact 113 is arranged between the Tr. group 122 and another Tr. group 122 positioned above, and the well contact 113 is not provided between the PD groups 121. Therefore, influence caused by a difference between the pixels may remain. In such a case, the well contact 113 can be arranged between the PD and the PD as in an example shown in FIG. 5. In the case of arranging the well contact 113 between the 4 pixels of the respective steps, the difference of the characteristic between the pixels may be reduced.

As described above, the present technology is applicable in the case where the sharing unit is shaped in a rectangle such as 2-pixel sharing, 8-pixel sharing, and 16-pixel sharing of 4-Tr. type. In other words, the number of pixels to be shared is not limited, and arrangement of the solid-state imaging device is not limited to the above-described arrangement examples as long as arrangement of the photodiodes in the one sharing unit is shaped in a rectangle.

Additionally, as for arrangement of the Trs., varied arrangement of 4-Tr. type, 8-pixel sharing (2×4 pixels) described above in a first embodiment can be applied to 2-pixel sharing and 16-pixel sharing.

Fourth Embodiment

<Exemplary Configuration of Solid-State Imaging Device According to Present Technology>

Figure 11:
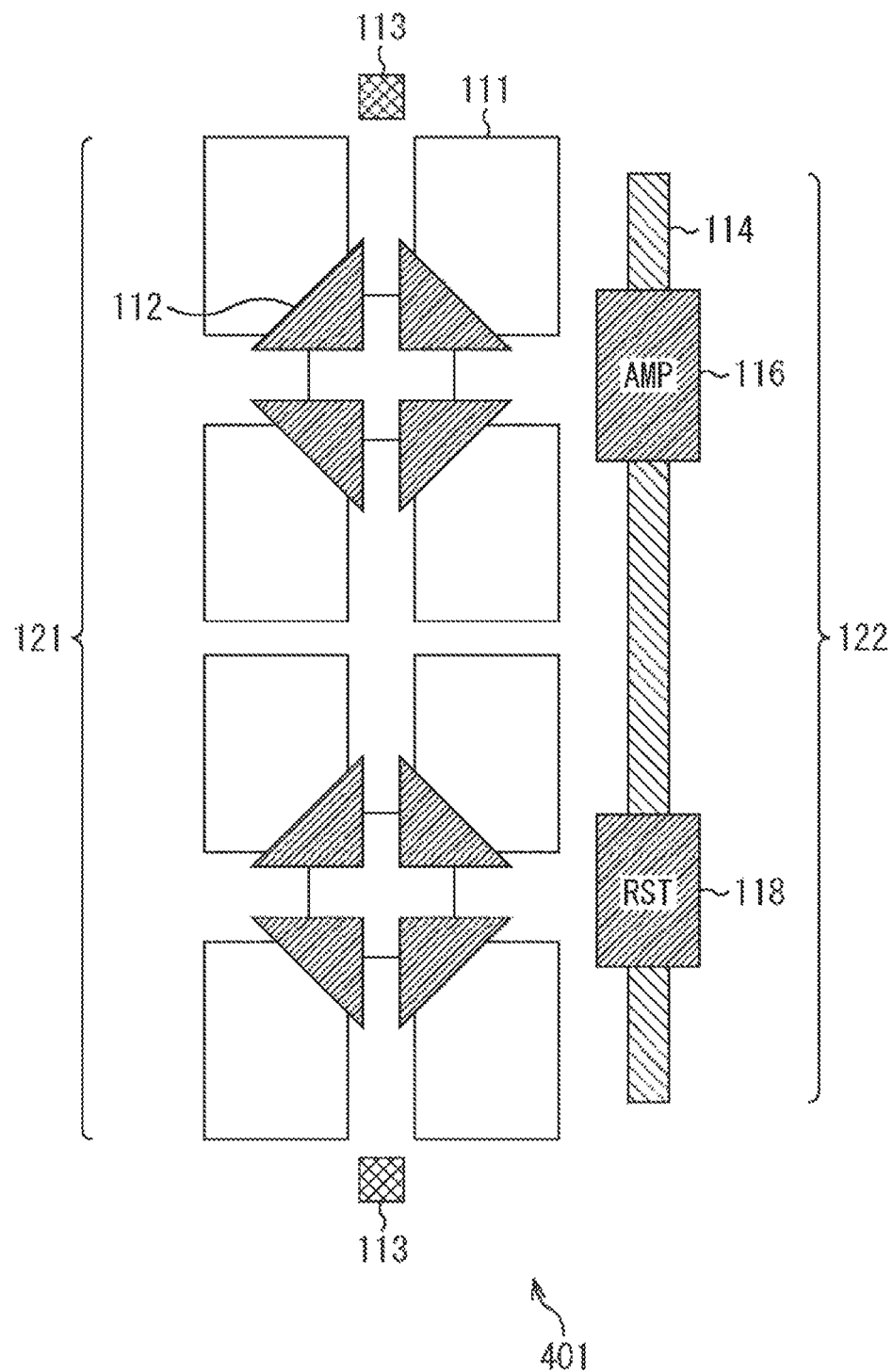
FIG. 11 is a diagram illustrating a fourth exemplary configuration of the solid-state imaging device to which the present technology is applied.

FIG. 11 is a diagram illustrating an exemplary configuration of a solid-state imaging device to which the present technology is applied. In the example of FIG. 11, a case in which the solid-state imaging device includes a backside illumination type CMOS sensor of 3-Tr. type, 8-pixel sharing (2×4 pixels).

Generally, in the 3-Tr. type, two transistors of a reset Tr. (RST) and an amplification Tr. (AMP) described above are included besides a photodiode area where photodiodes are arranged, and no selection Tr. (SEL) is provided. Further, it is assumed that the transfer Tr. is provided in the photodiode area because the transfer Tr. is directly connected to the photodiode.

A solid-state imaging device 401 in FIG. 11 differs from a solid-state imaging device 101 in FIG. 5 in that a selection Tr. 115 and a dummy Tr. 117 are excluded from one Tr. group 122. The solid-state imaging device 401 of FIG. 11 is in common with the solid-state imaging device 101 in FIG. 5 in a point of being arranged within a rectangular shaped sharing unit (a PD group is arranged right beside a Tr. group).

More specifically, in the Tr. group 122, an amplification Tr. 116 is arranged beside 4 pixels of transfer Trs. 112 on an upper side of the drawing, and a reset Tr. 118 is arranged beside 4 pixels of transfer Trs. 112 of on a lower side of the drawing. In the example of FIG. 11, the amplification Tr. 116 and the reset Tr. 118 are formed in a substantially same size.

Figure 12:
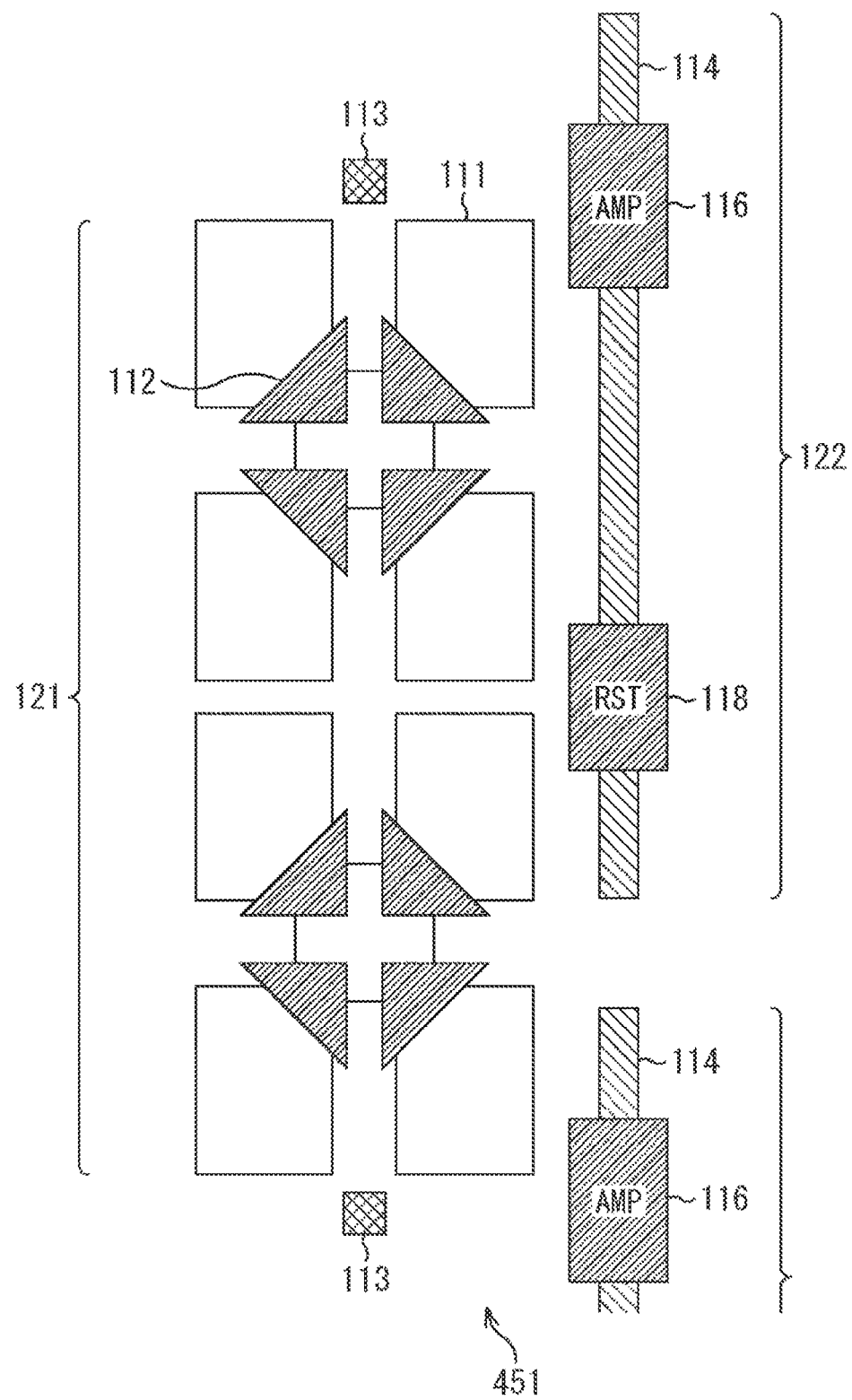
FIG. 12 is a diagram illustrating another different arrangement example of transistors.

Meanwhile, in a solid-state imaging device 451 of FIG. 12, for example, an arrangement position of the Tr. group 122 in FIG. 11 is shifted upward by about a length of a long side of one photodiode 111 in the drawing. More specifically, in the Tr. group 122, the amplification Tr. 116 is arranged beside the 4 pixels of photodiodes 111 but not on a side of the transfer Trs. 112 on the upper side of the drawing, and the reset Tr. 118 is arranged beside the 4 pixels of photodiodes 111 but not on the side of the transfer Trs. 112 on the lower side of the drawing. In the example of FIG. 12 also, the amplification Tr. 116 and the reset Tr. 118 are formed in a substantially same size.

In other words, in both the solid-state imaging device 401 of FIG. 11 and the solid-state imaging device 451 of FIG. 12, an L-length of an existing Tr. can be elongated as shown by the L-length of the amplification Tr. 116 because the Tr. group 122 is arranged along a long side of the PD group 121. With this configuration, RN performance can be improved. Further, in both the solid-state imaging device 401 of FIG. 11 and the solid-state imaging device 451 of FIG. 12, PRNU can be improved because polysilicon of the Trs. is symmetric with respect to the photodiodes.

As described above, as for the 3-Tr. type also, the present technology is applicable to all of the cases in which the sharing unit is in the shape of a rectangle. In other words, the number of pixels to be shared is not limited, and arrangement of the solid-state imaging device is not limited to the above-described arrangement examples as long as the arrangement of the photodiodes in the one sharing unit is shaped in a rectangle.

Meanwhile, in the above description, the examples (vertical type examples) in which a short side of one pixel sharing is arranged the upper side of the drawing and a long side of the one pixel sharing unit is arranged along a right side of the drawing have been described. However, results are the same even in the case of layout of the solid-state imaging device is made such that the long side of the one pixel sharing unit is arranged on the upper side of the drawing and the short side of the one pixel sharing unit is arranged on a left side of the drawing by rotating the above-described examples by 90 degrees.

As described above, according to the present technology, RN (random noise) margin or performance can be improved because the L-length of the Tr. (particularly, amplification Tr.) can be elongated.

More specifically, in the case where the AMP and the SEL are arranged in a group 1 and two Trs. are arranged in a group 2 in a solid-state imaging device, the required number of source drains is three in the group 1 and three in the group 2, i.e., six in total. At this point, there is a limit in elongating the L-length of the Tr. because of limitation in a lithography line width, limitation in processing the polysilicon and a contact hole, securing isolation breakdown voltage, and so on. Particularly, in the case of miniaturization, the influence from such a state is quite serious, and RN margin may be deteriorated due to the short L-length of the AMP.

In contrast, according to the present technology, RN performance can be improved because the L-length of the amplification Tr. can be elongated. Note that the L-length of the amplification Tr. is 0.6 to 1.4 times of a pitch of the PD group in the above-described example. Additionally, according to the present technology, the L-length of the selection Tr. can be elongated. Therefore, in the case of elongating an L-length of the selection Tr., a short channel effect may be avoided and a robust random noise margin property may be obtained.

The above effects can be obtained and is particularly advantageous in the case of miniaturizing a pixel size to about 1.0 mm or less.

Additionally, according to the present technology, PRNU can be improved because arrangement is made so as to have symmetry of the polysilicon of the Trs. Meanwhile, the configuration where the present technology is applied to the CMOS solid-state imaging device has been described above, but the present technology may be applied to the solid-state imaging device such as a CCD (charge coupled device) solid-state imaging device.

Note that the solid-state imaging device may be either a backside illumination type or a front side illumination type.

Further, the solid-state imaging device may be either a global shutter type or not. The solid-state imaging device is not limited to the global shutter type.

Note that application of the present technology is not limited to the solid-state imaging device, and the present technology is applicable to an imaging device. Here, the imaging device means a camera system such as a digital still camera and a digital video camera, and an electronic apparatus provided with an imaging function, such as a cell phone. Note that the image device may have a module type configuration, namely, a camera module, mounted on the electronic apparatus.

5. Fifth Embodiment

<Exemplary Configuration of Electronic Apparatus>

Here, a description will be given for an exemplary configuration of an electronic apparatus according to a second embodiment of the present technology with reference FIG. 13.

Figure 13:
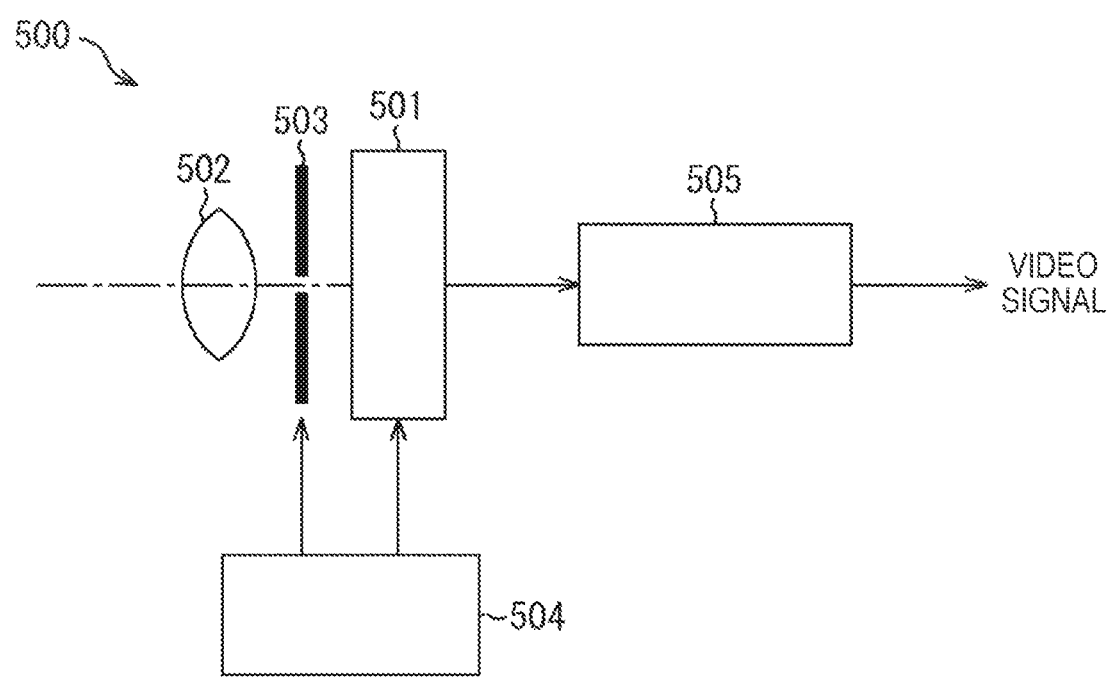
FIG. 13 is a block diagram illustrating an exemplary configuration of an electronic apparatus to which the present technology is applied.

An electronic apparatus 500 illustrated in FIG. 13 includes a solid-state imaging device (device chip) 501, an optical lens 502, a shutter device 503, a drive circuit 504, and a signal processing circuit 505. For the solid-state imaging device 501, a solid-state imaging device according to above-described first to fourth embodiments of the present technology is provided. Therefore, the electronic apparatus 500 having high performance and provided with improved RN performance and PRNU can be provided.

The optical lens 502 forms, on an imaging surface of the solid-state imaging device 501, an image light (incident light) from an object. By this, signal charge is accumulated inside the solid-state imaging device 501 for a predetermined period. The shutter device 503 controls an irradiation time and a shielding time for the solid-state imaging device 501.

The drive circuit 504 supplies a drive signal that controls signal transfer operation of the solid-state imaging device 501 and shutter operation of the shutter device 503. The solid-state imaging device 501 transfers a signal in accordance with the drive signal (timing signal) supplied from the drive circuit 504. The signal processing circuit 505 executes various kinds of signal processing for the signal output from the solid-state imaging device 501. A video signal applied with the signal processing is stored in a storage medium such as a memory, or output to a monitor.

Meanwhile, in the present specification, steps to describe a series of the above-described processing may obviously include the processing executed in time series in accordance with the described order, but also may include processing executed in parallel or individually although not constantly executed in time series.

Also, the embodiments according to the present disclosure may not be limited to the above-described embodiments, and various kinds of changes may be made in the scope without departing from the gist of the present disclosure.

Further, respective steps described in flowcharts above may be executed by one device and also by a plurality of devices in a sharing manner.

Further, in the case where one step includes a plurality of processing, the plurality of processing included in the one step may be executed by one device and also by a plurality of devices in a sharing manner.

Furthermore, the configuration described above as one device (or processing section) may be divided, and may be configured as a plurality of devices (or processing sections). In reverse, the configuration described above as the plurality of devices (or processing sections) may be integrally configured as one device (or processing section). Further, the respective devices (or respective processing section) may be added with a configuration other than the above-described configuration. Additionally, as long as configurations and operation are substantially same as an entire system, a part of a configuration of a device (or processing section) may be included in other devices (or other processing sections). In other words, the present technology is not limited to the above-described embodiments, and various kinds of changes may be made in the scope without departing from the gist of the present technology.

While preferred embodiments of the present disclosure have been described in detail with reference to the drawings, the present disclosure is not limited thereto. It should be understood that those skilled in the art of this technical field of the present disclosure may obviously conceive various modifications and alterations within the scope of the technical ideas recited in the appended claims, and such modifications and alterations obviously belong to the technical scope of the present disclosure. In addition, the present disclosure may have the following configurations.

(1) An imaging device, comprising: a shared-pixel structure, including: a plurality of photodiodes, wherein each photodiode in the plurality of photodiodes is located within a rectangular area;
a plurality of shared transistors, wherein each transistor in the plurality of shared transistors is adjacent one side of the rectangular area containing the plurality of photodiodes.

(2) The imaging device of the above (1), wherein the rectangular area has two short sides and two long sides, and wherein each of the shared transistors is adjacent one of the long sides of the rectangular area containing the plurality of photodiodes.

(3) The imaging device of the above (2), wherein the shared transistors in the plurality of shared transistors of the shared-pixel structure are arranged along a line that is parallel to the one of the long sides of the rectangular area.

(4) The imaging device of any of (1) to (3), wherein the shared transistors in the plurality of shared transistors of the shared-pixel structure are outside of the rectangular area.

(5) The imaging device of any of (1) to (4), wherein the shared transistors in the plurality of shared transistors includes at least one of an amplification transistor, a select transistor, and a reset transistor.

(6) The imaging device of (2) or (3), wherein the shared transistors in the plurality of shared transistors include at least one amplification transistor and at least one other transistor, and wherein a length of the amplification transistor along a dimension of the amplification transistor that is parallel to the long sides of the rectangular area is longer than a length of the at least one other transistor along a length of the other transistor that is parallel to the long sides of the rectangular area.

(7) The imaging device of (2) or (3), wherein the plurality of photodiodes is a photoelectric conversion element group including a sharing unit located within the rectangular area, and wherein the plurality of shared transistors is a pixel transistor group arranged so as to be substantially symmetric with respect to the photoelectric conversion element group.

(8) The imaging device of the above (7), further comprising: a well contact, wherein the well contact is provided between the photoelectric conversion element group and another photoelectric conversion element group positioned next to the photoelectric conversion element group.

(9) The imaging device of any of (1) to (8), wherein the plurality of shared transistors include a dummy transistor.

(10) The imaging device of (2) or (3), wherein the plurality of shared transistors includes at least one selection transistor and at least one other transistor, and wherein a length of the selection transistor along a dimension of the selection transistor that is parallel to the long sides of the rectangular area is longer than a length of the at least one other transistor along a length of the other transistor that is parallel to the long sides of the rectangular area.

(11) An electronic apparatus, comprising: an imaging device with a shared-pixel structure, the shared pixel structure including: a plurality of photodiodes, wherein each photodiode in the plurality of photodiodes is located within a rectangular area; a plurality of shared transistors, wherein each transistor in the plurality of shared transistors is adjacent one side of the rectangular area containing the plurality of photodiodes.

(12) The electronic apparatus of the above (11), wherein the rectangular area has two short sides and two long sides, and wherein each of the shared transistors is adjacent one of the long sides of the rectangular area containing the plurality of photodiodes.

(13) The electronic apparatus of the above (12), wherein the shared transistors in the plurality of shared transistors of the shared-pixel structure are arranged along a line that is parallel to the one of the long sides of the rectangular area.

(14) The electronic apparatus of any of (11) to (13), wherein the shared transistors in the plurality of shared transistors of the shared-pixel structure are outside of the rectangular area.

(15) The electronic apparatus of any of (11) to (14), wherein the shared transistors in the plurality of shared transistors include at least one of an amplification transistor, a select transistor, and a pixel transistor.

(16) The electronic apparatus of (12) or (13), wherein the shared transistors in the plurality of shared transistors include at least one amplification transistor and at least one other transistor, and wherein a length of the amplification transistor along a dimension of the amplification transistor that is parallel to the long sides of the rectangular area is longer than a length of the at least one other transistor along a length of the other transistor that is parallel to the long sides of the rectangular area.

(17) The electronic apparatus of (12) or (13), wherein the plurality of photodiodes is a photoelectric conversion element group including a sharing unit located within the rectangular area, and wherein the plurality of shared transistors is a pixel transistor group arranged so as to be substantially symmetric with respect to the photoelectric conversion element group.

(18) The electronic apparatus of the above (17), further comprising: a well contact, wherein the well contact is provided between the photoelectric conversion element group and another photoelectric conversion element group positioned next to the photoelectric conversion element group.

(19) The electronic apparatus of any of (11) to (18), wherein the plurality of shared transistors includes a dummy transistor.

(20) The electronic apparatus of (12) or (13), wherein the plurality of shared transistors includes at least one selection transistor and at least one other transistor, and wherein a length of the selection transistor along a dimension of the amplification transistor that is parallel to the long sides of the rectangular area is longer than a length of the at least one other transistor along a length of the other transistor that is parallel to the long sides of the rectangular area.

REFERENCE SIGNS LIST

1 Solid-state imaging device
2 Pixel
3 Pixel area
101 Solid-state imaging device
111 Photodiode
112 Transfer Tr.
113 Well contact
114 Source drain
115 Selection Tr.
116 Amplification Tr.
117 Dummy Tr.
118 Reset Tr.
121 PD group
122 Tr. group
151, 201 Solid-state imaging device
211 Amplification Tr.
251, 301, 351, 401, 451 Solid-state imaging device
500 Electronic apparatus
501 Solid-state imaging device
502 Optical lens
503 Shutter device
504 Drive circuit
505 Signal processing circuit

What is claimed is:

1. A light detecting device, comprising:
a first unit including eight photodiodes, eight transfer transistors, a first floating diffusion region, and a second floating diffusion region in a plan view, wherein the eight photodiodes include:
four photodiodes on an upper side of the first unit, and four photodiodes on a lower side of the first unit;
a second unit including eight photodiodes, eight transfer transistors, a third floating diffusion region, and a fourth floating diffusion region, wherein the second unit is adjacent to the first unit in the plan view;
a third unit including a first reset transistor, a first amplification transistor, a first select transistor, and a first transistor, wherein
the third unit is between the first unit and the second unit in the plan view,
the eight photodiodes of the first unit share the first amplification transistor,
the first transistor is between the first amplification transistor and the first reset transistor in the plan view,
the first transistor and the first reset transistor have a common source drain region, and
the first amplification transistor is closer to the four photodiodes on the upper side of the first unit than the four photodiodes on the lower side of the first unit; and
a fourth unit including a second reset transistor, a second amplification transistor, a second select transistor, and a second transistor, wherein
the eight photodiodes of the second unit share the second amplification transistor, and
the second unit is between the third unit and the fourth unit in the plan view.

2. The light detecting device of claim 1, wherein
the first unit is within a first rectangular area, and
the second unit is within a second rectangular area in the plan view.

3. The light detecting device of claim 1, wherein the first transistor is between the first reset transistor and the first select transistor in the plan view.

4. The light detecting device of claim 1, wherein the first transistor is a dummy transistor.

5. The light detecting device of claim 1, wherein the light detecting device is a backside-illumination type light detecting device.

6. The light detecting device of claim 1, further comprising a well contact in the plan view.

7. The light detecting device of claim 1, wherein the first amplification transistor, the first reset transistor, the first select transistor, and the first transistor are in a specific direction.

8. The light detecting device of claim 1, wherein the eight photodiodes of the first unit further share the first select transistor and the first transistor.

9. The light detecting device of claim 1, wherein the first floating diffusion region and the second floating diffusion region are coupled to the first amplification transistor.

10. The light detecting device of claim 1, wherein the first amplification transistor has a length longer than each of the first reset transistor, the first select transistor, and the first transistor.

11. An electronic apparatus, comprising:
a light detecting device that comprises:
a first unit including eight photodiodes, eight transfer transistors, a first floating diffusion region, and a second floating diffusion region in a plan view,
wherein the eight photodiodes include:
four photodiodes on an upper side of the first unit, and four photodiodes on a lower side of the first unit;
a second unit including eight photodiodes, eight transfer transistors, a third floating diffusion region, and a fourth floating diffusion region, wherein the second unit is adjacent to the first unit in the plan view;
a third unit including a first reset transistor, a first amplification transistor, a first select transistor, and a first transistor, wherein
the third unit is between the first unit and the second unit in the plan view,
the eight photodiodes of the first unit share the first amplification transistor and the first reset transistor,
the first transistor is between the first amplification transistor and the first reset transistor in the plan view, the first transistor and the first reset transistor have a common source drain region, and the first amplification transistor is closer to the four photodiodes on the upper side of the first unit than the four photodiodes on the lower side of the first unit; and a fourth unit including a second reset transistor, a second amplification transistor, a second select transistor, and a second transistor, wherein the eight photodiodes of the second unit share the second amplification transistor, and the second unit is between the third unit and the fourth unit in the plan view.

* * * * *